(12) United States Patent
Castro

(10) Patent No.: US 10,366,747 B2
(45) Date of Patent: Jul. 30, 2019

(54) COMPARING INPUT DATA TO STORED DATA

(71) Applicant: Micron Technology, Inc., Boise, ID (US)

(72) Inventor: Hernan A. Castro, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/827,019

(22) Filed: Nov. 30, 2017

(65) Prior Publication Data

US 2019/0164600 A1 May 30, 2019

(51) Int. Cl.
*G11C 13/00* (2006.01)
*G11C 11/56* (2006.01)

(52) U.S. Cl.
CPC ........ *G11C 11/5678* (2013.01); *G11C 13/004* (2013.01); *G11C 13/0069* (2013.01); *G11C 2013/0052* (2013.01); *G11C 2013/0073* (2013.01); *G11C 2213/77* (2013.01)

(58) Field of Classification Search
CPC ................................................ G11C 13/0002
USPC ........................................................ 365/148
See application file for complete search history.

(56) References Cited

U.S. PATENT DOCUMENTS

| | | | |
|---|---|---|---|
| 7,307,268 B2 | 12/2007 | Scheuerlein | |
| 7,308,067 B2 * | 12/2007 | Lowrey | G11C 13/0004 365/163 |
| 9,036,408 B1 | 5/2015 | Jurasek et al. | |
| 9,312,005 B2 | 4/2016 | Castro | |
| 2008/0013370 A1 | 1/2008 | Johnson | |
| 2008/0117669 A1 | 5/2008 | Fuji et al. | |
| 2008/0123395 A1 | 5/2008 | Nakai | |
| 2009/0244962 A1* | 10/2009 | Gordon | G11C 8/10 365/163 |
| 2010/0080040 A1 | 4/2010 | Choi | |
| 2012/0287706 A1* | 11/2012 | Lung | H01L 45/06 365/163 |
| 2014/0056090 A1 | 2/2014 | Kwon et al. | |
| 2014/0209892 A1* | 7/2014 | Kuo | G11C 8/10 257/43 |
| 2014/0237298 A1* | 8/2014 | Pe'er | G11C 16/3418 714/42 |
| 2015/0074326 A1* | 3/2015 | Castro | G11C 13/0004 711/101 |
| 2015/0179255 A1* | 6/2015 | Sarpatwari | G11C 13/0038 365/148 |
| 2015/0262661 A1 | 9/2015 | Chu et al. | |
| 2016/0217035 A1 | 7/2016 | Chen et al. | |

(Continued)

OTHER PUBLICATIONS

Borghetti, et al. "Memristive switches enable 'stateful' logic operations via material implication", Nature International Journal of Science, vol. 464. pp. 873-876, Apr. 8, 2010.

(Continued)

*Primary Examiner* — Min Huang
(74) *Attorney, Agent, or Firm* — Brooks, Cameron & Huebsch, PLLC

(57) ABSTRACT

In an example, a method may include comparing input data to stored data stored in a memory cell and determining whether the input data matches the stored data based on whether the memory cell snaps back in response to an applied voltage differential across the memory cell.

26 Claims, 17 Drawing Sheets

(56) References Cited

U.S. PATENT DOCUMENTS

2017/0125097 A1 5/2017 Tortorelli et al.
2017/0221562 A1* 8/2017 Buchanan .......... G11C 13/0064
2017/0243639 A1* 8/2017 Kang ...................... G11C 7/04
2017/0309341 A1 10/2017 Eldredge et al.

OTHER PUBLICATIONS

Chen, et al. "Efficient in-memory computing architecture based on crossbar arrays", IEEE International Electron Devices Meeting (IEDM), 4 pp. Dec. 7-9, 2015.
Kvatinsky "Memristor-Based Material Implication (IMPLY) Logic: Design Principles and Methodologies", IEEE Translation on Very Large Scale Integration (VLSI) Systems, vol. 22, No. 10, p. 2054-2066, Oct. 2014.
International Search Report and Written Opinion from related international application No. PCT/US2018/061175, dated Feb. 28, 2019, 14 pp.
International Search Report and Written Opinion from international application No. PCT/US2018/061183, dated Feb. 28, 2019, 12 pp.

* cited by examiner

COMPARING INPUT DATA TO STORED DATA

TECHNICAL FIELD

The present disclosure relates generally to operating apparatus, such as memories, and, more particularly, to comparing input data to stored data.

BACKGROUND

Memory devices may typically be provided as internal, semiconductor, integrated circuits in computers or other electronic devices. There are various types of memory including volatile and non-volatile memory.

Various memory arrays can be organized in a cross-point architecture with memory cells (e.g., two terminal cells) being located at intersections of a first and second signal lines used to access the cells (e.g., at intersections of word lines and bit lines). Some memory cells can be, for example, resistance variable memory cells whose state (e.g., stored data value) depends on the programmed resistance of the memory cell. Some resistance variable memory cells can comprise a select element (e.g., a diode, transistor, or other switching device) in series with a storage element (e.g., a phase change material, metal oxide material, and/or some other material programmable to different resistance levels). Some variable resistance memory cells, which may be referred to as self-selecting memory cells, comprise a single material which can serve as both a select element and a storage element for the memory cell.

DETAILED DESCRIPTION

Figure 1:
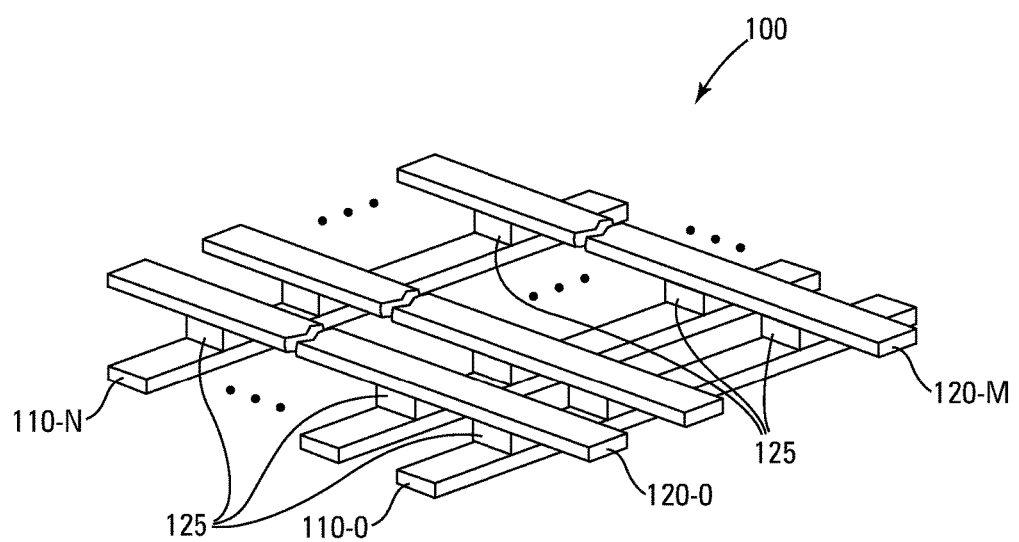
FIG. 1 is a three-dimensional view of an example of a memory array, in accordance with a number of embodiments of the present disclosure.

In an example, a method may include comparing input data to stored data stored in a memory cell and determining whether the input data matches the stored data based on whether the memory cell snaps back in response to an applied voltage differential across the memory cell.

A number of embodiments of the present disclosure provide benefits, such as reduced power consumption and faster operation compared to previous devices. For example, the present disclosure may prevent subsequent comparisons between a group of input data values and data values stored in a group of memory cells in response to one of the input data values mismatching a corresponding data value stored in one of the memory cells. This, for example, may act to reduce power consumption and to reduce comparison times. For example, current may be turned off to a signal line coupled to the group of memory cells (e.g., thereby reducing power consumption).

In some examples, a memory cell may be operated to implement an XOR function. This may be enabled, for example, by utilizing the asymmetric nature of the threshold voltage of the memory cell, the magnitude of which can vary based on the polarity of signals used to program the cell.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

FIG. 1 is a three-dimensional view of an example of a memory array 100 (e.g., a cross-point memory array), in accordance with a number of embodiments of the present disclosure. Memory array 100 may include a plurality of first signal lines (e.g., first access lines), which may be referred to as word lines 110-0 to 110-N, and a plurality second signal lines (e.g., second access lines), which may be referred to as bit lines 120-1 to 120-M that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance-variable memory cells, for example. The memory cells 125 may include a material programmable to different data states. In some examples, each of memory cells 125 may include a material that may act as a selector material (e.g., a switching material) and a storage material, so that each memory cell 125 may act as both a selector device and a memory element. For example, each memory cell may include a chalcogenide material that may be formed of various doped or undoped materials, that may or may not be a phase-change material, and/or that may or may not undergo a phase change during reading and/or writing the memory cell. In some examples, each memory cell 125 may include a ternary composition that may include selenium (Se), arsenic (As), and germanium (Ge), a quaternary composition that may include silicon (Si), Se, As, and Ge, etc.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may snap back from a non-conductive (e.g., high-impedance) state to a conductive (e.g., lower impedance) state in response to the applied voltage differential exceeding the threshold voltage. For example, a memory cell snapping back may refer to the memory cell transitioning from a high-impedance state to a lower impedance state responsive to a voltage differential applied across the memory cell being greater than the threshold voltage of the memory cell. A threshold voltage of a memory cell snapping back may be referred to as a snapback event, for example.

Figure 2A:
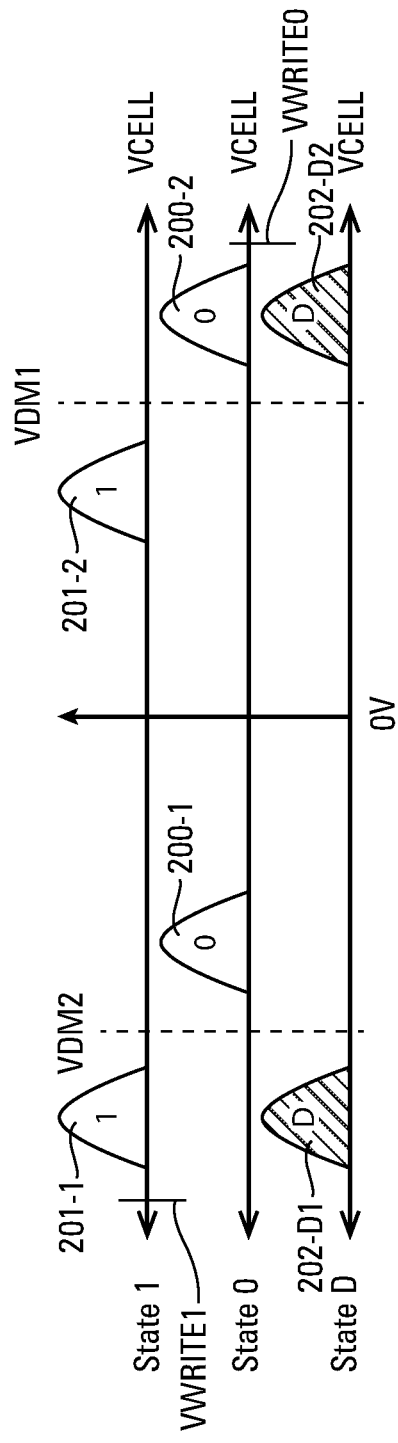
FIG. 2A illustrates threshold voltage distributions associated with memory states of memory cells, in accordance with a number of embodiments of the present disclosure.

FIG. 2A illustrates threshold distributions associated with various states of memory cells, such as memory cells 125 (e.g., state 0, state 1, and state D), in accordance with a number of embodiments of the present disclosure. In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 200-1, 200-2, 201-1, 201-2, 202-D1, and 202-D2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
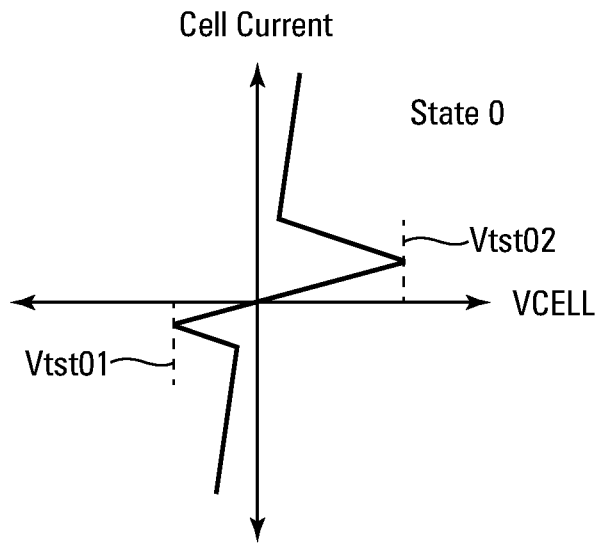
FIG. 2B is an example of a current-versus-voltage curve corresponding to a memory state of FIG. 2A, in accordance with a number of embodiments of the present disclosure.
Figure 2C:
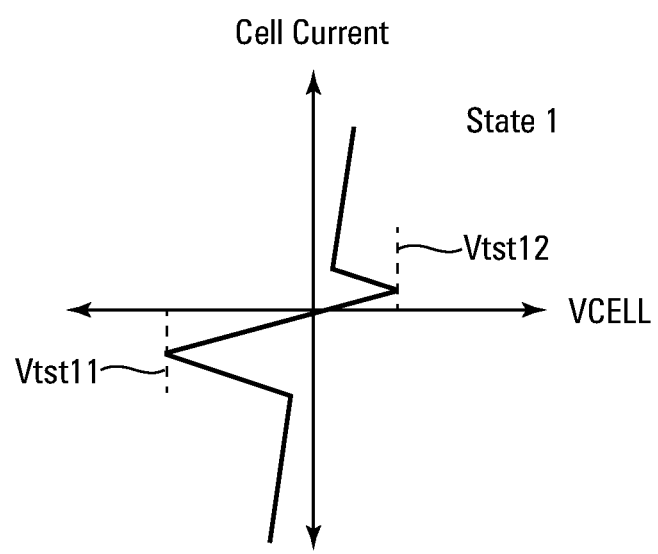
FIG. 2C is an example of a current-versus-voltage curve corresponding to another memory state of FIG. 2A, in accordance with a number of embodiments of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 may have a different magnitude in one polarity than in an opposite polarity. For example, an applied voltage magnitude sufficient to cause a memory cell 125 to snap back can be different (e.g., higher or lower) for one applied voltage polarity than the other.

In various embodiments, the threshold voltage of a memory cell may drift (e.g., to a higher absolute value) over time, as indicated by threshold distributions 202-D1 and 202-D2, that may be referred to as drifted states. For example, a memory cell programmed to a distribution 201-2 may drift toward distribution 202-D2 over time. Similarly, a memory cell programmed to a distribution 200-2 may also drift to a higher threshold voltage over time.

A memory cell programmed to a distribution 200-1 may drift toward distribution 202-D1 over time. A memory cell programmed to distribution 201-1 may also drift toward a higher threshold voltage in a negative sense over time.

FIG. 2A illustrates demarcation voltages VDM1 and VDM2, which can be used to determine the state of a memory cell (e.g., to distinguish between state "1" and state "0" as part of a read operation). In this example, VDM1 is a positive voltage used to distinguish cells in state 1 (201-2) from cells in state 0 (200-2) or drifted state 202-D2. Similarly, VDM2 is a negative voltage used to distinguish cells in state 0 (200-1) from cells in state 1 (201-1) or drifted state 202-D1. In the examples of FIGS. 2A-2C, a memory cell 125 in a positive state 0 does not snap back in response to applying VDM1; a memory cell 125 in a positive state 1 snaps back in response to applying VDM1; a memory cell 125 in a negative state 0 snaps back in response to applying VDM2; and a memory cell 125 in a negative state 1 does not snap back in response to applying VDM2.

Embodiments are not limited to the example shown in FIG. 2A. For example, the designations of state 0 and state 1 can be interchanged (e.g., distributions 201-1 and 201-2 can be designated as state 0 and distributions 200-1 and 200-2 can be designated as state 1).

In some examples, cell threshold voltage drift may be accelerated electrically and/or thermally. For example, an electric field and/or heat may be applied to the memory cell to accelerate drift. In some examples, a memory cell 125 may be programmed to state 0 or state 1 from the drift state.

FIGS. 2B and 2C are examples of current-versus-voltage curves corresponding to the memory states of FIG. 2A, in accordance with a number of embodiments of the present disclosure. As such, in this example, the curves in FIGS. 2B and 2C correspond to cells in which state 0 is designated as the higher threshold voltage state in a particular polarity (positive polarity direction in this example), and in which state 1 is designated as the higher threshold voltage state in the opposite polarity (negative polarity direction in this example). As noted above, the state designation can be interchanged such that state 1 could correspond to the higher threshold voltage state in the positive polarity direction with state 0 corresponding to the higher threshold voltage state in the negative direction.

FIGS. 2B and 2C illustrate snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 0 (e.g., 200-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 0 (e.g., 200-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 1 (e.g., 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 1 (e.g., 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 0 cell, the resulting snapback event may reduce the threshold voltage of the cell to a level below VDM1, which would result in the cell being read as state 1 (e.g., 201-2). As such, in a number of embodiments, a snapback event can be used to write a cell to the opposite state (e.g., from state 1 to state 0 and vice versa).

As described further herein below, the threshold voltage distributions corresponding to programmed states can be asymmetric across polarities (e.g., different for forward/positive and reverse/negative biases). The designation of different states to the higher threshold voltages in opposite polarities (e.g., the higher threshold voltage in the forward direction being designated as state 0 and the higher threshold voltage in the reverse direction being designated as state 1) can be exploited to perform in memory compute functions in accordance with embodiments described herein. For instance, in a number of embodiments, memory cells can be operated to implement an XOR (exclusive or) function. Performing XOR functions can be used, for example, to perform comparison operations to determine whether input data (e.g., an input vector) matches data stored in an array. In a number of embodiments, XOR functions can be used to perform higher order operations such as addition, subtraction, multiplication, division, etc.

Figure 3:
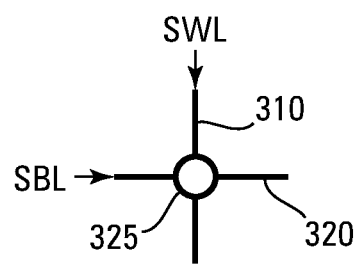
FIG. 3 illustrates an example of voltage signals that can applied to a memory cell in association with comparing input data to data stored in the memory cell, in accordance with a number of embodiments of the present disclosure.

FIG. 3 illustrates an example of voltage signals that can applied to a memory cell in association with comparing input data to data stored in the memory cell, in accordance with a number of embodiments of the present disclosure. FIG. 3 includes a memory cell 325, which can be a memory cell such as memory cell 125 described above. The memory cell 325 is coupled to a word line (WL) 310 and a bit line (BL) 320. A voltage signal SBL is applied to bit line 320 and a voltage signal SWL is applied to word line 310, where a difference between voltage signal SBL and voltage signal SWL corresponds to a voltage differential applied across memory cell 325. Analogous to FIGS. 2A-2C, the example shown in FIG. 3 corresponds to cells in which the higher threshold voltage in the forward (e.g., positive polarity) direction is designated as state 0 and the higher threshold voltage in the reverse direction (e.g., negative polarity) is designated state 1. Accordingly, a positive voltage differential VDM1 is used to determine cell state in the forward direction and a negative differential VDM2 is used to determine cell state in the reverse direction. In a number of embodiments, input states (e.g., data values) can be mapped to the designated voltage demarcation levels (e.g., VDM1 and VDM2) in order to compare input data values to stored data values, which can implement an XOR function, for example.

For instance, voltage signal SWL may have a voltage VWL1 and voltage signal SBL may have a voltage VBL1 such that an applied voltage differential VDM1 (e.g., VDM1=VBL1−VWL1) can correspond to an input state 0 (e.g., a logic 0), or voltage signal SWL may have a voltage VWL2 and voltage signal SBL may have a voltage VBL2 such that an applied voltage differential VDM2 (e.g., VDM2=VBL2−VWL2) can correspond to an input state 1 (e.g., a logic 1). For example, when state 0 is the input state (e.g., a state to be compared to a stored state of a cell), the input voltage differential applied to (e.g., across) memory cell 325 may be VDM1 (e.g., with the bit line 320 being driven high to voltage VBL1 and the word line 310 being driven low to voltage VWL1). When state 1 is the input state, the input voltage differential applied to memory cell 325 may be VDM2 (e.g., with the bit line 320 being driven low to voltage VBL2 and the word line 310 being driven high to voltage VWL2). Accordingly, the polarity of the applied VDM1 signal is opposite the polarity of the VDM2 signal.

With reference to the threshold distributions shown in FIG. 2A for memory cells having snapback characteristics such as that shown in FIGS. 2B and 2C, an input state 0 can be compared to the stored state of a memory cell (e.g., 325) by applying the corresponding input voltage signal (e.g., VDM1) to the cell and determining (e.g., sensing) whether or not a snapback event occurs. Similarly, an input state 1 can be compared to the stored state of the memory cell by applying the corresponding voltage signal (e.g., VDM2) to the cell and sensing whether or not a snapback event occurs. Table 1 below is a truth table illustrating an example in which the results of the comparisons of input states to stored states corresponds to an XOR function.

For instance, to determine whether an input state 0 matches a data state stored in a memory cell, VDM1 can be applied to the cell. If the cell stores state 0 (e.g., 200-2), or has drifted to state 202-D2, a snapback event will not occur (e.g., since VDM1 is below the threshold voltage level of the cell). If the cell stores state 1 (e.g., 201-2) a snapback event will occur (e.g., since VDM1 is above the cell threshold voltage level). Accordingly, detection of a snapback event responsive to applied voltage VDM1 indicates a mismatch (e.g., the input data state 0 does not match the stored state 1), and lack of detection of a snapback event responsive to applied voltage VDM1 indicates a match (e.g., the input state 0 is the same as the stored data state or is in a drifted state D). Similarly, to determine whether an input state 1 matches a data state stored in a memory cell, VDM2 can be applied to the cell. If the cell stores state 0 (e.g., 200-1) a snapback event will occur (e.g., since VDM2 is above the threshold voltage of the cell). If the cell stores state 1 (e.g., 201-1), or has drifted to state 202-D1, a snapback event will not occur (e.g., since VDM2 is below the cell threshold voltage level). Accordingly, detection of a snapback event responsive to applied voltage VDM2 indicates a mismatch (e.g., the input data state 1 does not match the stored state 0), and lack of detection of a snapback event responsive to applied voltage VDM2 indicates a match (e.g., the input state 1 is the same as the stored data state or is in a drifted state D).

Therefore, as shown below in Table 1, the results of the comparison operations correspond to an XOR function. That is, a match is determined only if the input state is the same as the stored state, and a mismatch is determined if the input state is different than the stored state.

In a number of embodiments, the drifted states 202-D1 and 202-D2 can be used in association with an additional input state (e.g., an input state other than state 0 or state 1), which may be referred to as input state Z (e.g., a "don't care" state). Since cells in a drifted state in either polarity have a threshold voltage above the snapback voltage, no snapback event will occur regardless of the applied voltage. Therefore, regardless of the stored state of the memory cell (e.g., state 0, state 1, or a drifted state), no snapback event will be detected responsive to the voltage signal SBL having a voltage VBLZ and the voltage signal SWL having a voltage VWLZ, and thus an applied voltage differential VDMZ (e.g., VDMZ=VBLZ−VWLZ). The voltage VDMZ may correspond to an inhibit voltage having a magnitude between respective snapback voltages of the memory cells (in either polarity). In this example, lack of detection of a snapback event corresponds to a "match" result.

Results of comparison operations including input state Z and drifted memory state D are included in Table 1. As illustrated, the third input state Z (e.g., "don't care") provides the ability to perform ternary operations, for example.

Table 1 is an example of a truth table corresponding to comparing input data to stored data as described in conjunction with FIGS. 2A-2C and FIG. 3.

TABLE 1

Result of comparing an input state to a state stored by a memory cell

| Input State | Stored State | Result |
| --- | --- | --- |
| 0 | 0 | Match (no snapback) |
| 0 | 1 | Mismatch (snapback) |
| 1 | 0 | Mismatch (snapback) |
| 1 | 1 | Match (no snapback) |
| Z | 0, 1, D | Match (no snapback) |
| 0, 1, Z | D | Match (no snapback) |

Although the examples previously described in conjunction with FIGS. 2A-2C and FIG. 3 and the example in Table 1 use a determined snapback event to indicate a mismatch result and lack of a snapback event to indicate a match, embodiments are not so limited. For instance, in other examples, a determined snapback event may indicate a match while a determined lack of a snapback event may indicate a mismatch.

Figure 4:
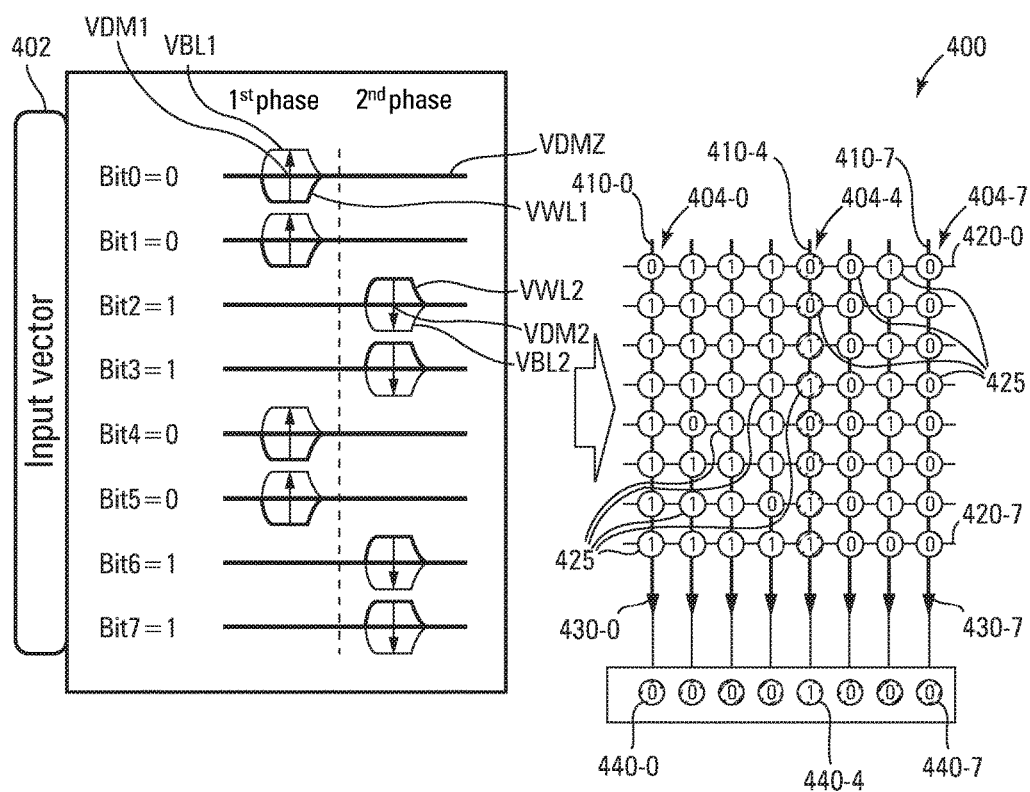
FIG. 4 illustrates an example of comparing input data to data stored in a memory array, in accordance with a number of embodiments of the present disclosure.

FIG. 4 illustrates an example of comparing input data (e.g., a group of input bit values) to data (e.g., groups of bit values) stored in a memory array 400 in accordance with a number of embodiments of the present disclosure. The array 400 can include memory cells such as those described above. As shown in FIG. 4, the input data may be an input vector 402 (e.g., "00110011" corresponding to bits Bit0 to Bit7 as shown) to be compared to data stored in memory array 400 (e.g., as bit vectors 404-0 to 404-7, which can be referred to collectively as bit vectors 404).

In this example, memory array 400 includes a plurality of first signal lines (e.g., word lines) 410-0 to 410-7 and a plurality of second signal lines (e.g., bit lines) 420-0 to 420-7). The array 400 can be a cross-point array with a memory cell 425 located at each bit line/word line crossing. Although eight bit lines and eight word lines are shown in the example of FIG. 4, embodiments are not limited to a particular number of word lines and/or bit lines.

In FIG. 4, the bit vectors 404 are stored in cells commonly coupled to a respective word line 410 (e.g., with bit 0 stored in a cell coupled to bit line 420-0, bit 1 coupled to bit line 420-1, . . . , bit 7 coupled to bit line 420-7). For instance, in this example, bit vector 404-0 ("01111111") is stored in cells coupled to word line 410-0, bit vector 404-1 ("11110111") is stored in cells coupled to word line 410-1, bit vector 404-2 ("11111111") is stored in cells coupled to word line 410-2, bit vector 404-3 ("11111101") is stored in cells coupled to word line 410-3, bit vector 404-4 ("00110011") is stored in cells coupled to word line 410-4, bit vector 404-5 ("00000000") is stored in cells coupled to word line 410-5, bit vector 404-6 ("11111110") is stored in cells coupled to word line 410-6, and bit vector 404-7 ("00000000") is stored in cells coupled to word line 410-7.

As shown in FIG. 4, detectors, which can comprise a sense amplifier 430, are coupled to each respective word line 410. For example, sense amplifiers 430-0 to 430-7 may be respectively coupled to word lines 410-0 to 410-7. In some examples, a sense amplifier 430 may be part of a word line driver (not shown in FIG. 4). A latch 440 may be coupled to each respective sense amplifier 430, and thus each respective word line 410. For example, latches 440-0 to 440-7 may be respectively coupled to sense amplifiers 430-0 to 430-7, and thus word lines 410-0 to 410-7. Latches 440-0 to 440-7 may respectively store data indicative of whether vectors 404-0 to 404-7 match input vector 402. In some examples, a sense amplifier 430 in combination with a respective latch 440 may be referred to as sensing circuitry.

As described above, comparing an input state 0 (e.g., bit value of 0) to a bit value stored in a memory cell (e.g., 425) can include applying the voltage differential VDM1, as previously described, to that memory cell. For example, comparing Bit0 of the input vector 402 (e.g., input state 0) to the bit value stored in the memory cell coupled to bit line 420-0 and word line 410-0 (e.g., stored state 0) can include applying a positive polarity voltage differential VDM1 to the memory cell (e.g., by applying the bit line voltage VBL1 to bit line 420-0 and the word line voltage VWL1 to word line 410-0). Bit0 of the input vector 402 may be compared to the bit 0 data values of each of the stored vectors 404 by applying the voltage differential VDM1 to each memory cell coupled to bit line 420-0. In some examples, while applying the bit line voltage VBL1 to bit line 420-0, the word line voltage VWL1 may be applied to the word lines 410-0 to 410-7 concurrently.

As used herein, multiple acts being performed concurrently is intended to mean that each of these acts is performed for a respective time period, and each of these respective time periods overlaps, in part or in whole, with each of the remaining respective time periods. In other words, those acts are concurrently performed for at least some period of time.

In a similar manner, Bit1 of the input vector 402 (e.g., input state 0) can be compared to bit 1 of the stored data vectors 404 by applying the voltage differential VDM1 to each memory cell coupled to bit line 420-1, Bit4 of the input vector 402 (e.g., input state 0) can be compared to bit 4 of the stored data vectors 404 by applying the voltage differential VDM1 to each memory cell coupled to bit line 420-4, and Bit5 of the input vector 402 (e.g., input state 0) can be compared to bit 5 of the stored data vectors 404 by applying the voltage differential VDM1 to each memory cell coupled to bit line 420-5. In some examples, the voltage differential VDM1 may be applied concurrently to (e.g., in parallel with) one or more memory cells coupled to bit lines 420-0, 420-1, 420-4, and 420-5 during a first phase (e.g., time period), as shown in FIG. 4. For example, Bit0, Bit1, Bit4, and Bit5 of the input vector 402 may be compared concurrently (e.g., in parallel) to bit 0, bit 1, bit 4, and bit 5, respectively, of the stored vectors 404 during the first phase. After the first phase, in an example, the voltage differential VDMZ, as described previously in conjunction with FIGS. 2A-2C and FIG. 3, may be applied to concurrently (e.g., in parallel) to one or more memory cells coupled to bit lines 420-0, 420-1, 420-4, and 420-5 during a second phase, as shown in FIG. 4.

Comparing an input state 1 (e.g., bit value of 1) to a bit value stored in a memory cell (e.g., 425) can include applying the voltage differential VDM2, as previously described, to that memory cell. For example, comparing Bit2 of the input vector 402 (e.g., input state 1) to the bit value stored in the memory cell coupled to bit line 420-2 and word line 410-0 (e.g., stored state 1) can include applying a negative polarity voltage differential VDM2 to the memory cell (e.g., by applying the bit line voltage VBL2 to bit line 420-0 and the word line voltage VWL2 to word line 410-0). Bit2 of the input vector 402 may be compared to the bit 2 data values of each of the stored vectors 404 by applying the voltage differential VDM2 to each memory cell coupled to bit line 420-0. In some examples, while applying the bit line voltage VBL2 to bit line 420-0, the word line voltage VWL2 may be applied to the word lines 410-0 to 410-7 concurrently.

In a similar manner, Bit3 of the input vector 402 (e.g., input state 1) can be compared to bit 3 of the stored data vectors 404 by applying the voltage differential VDM2 to each memory cell coupled to bit line 420-3, Bit6 of the input vector 402 (e.g., input state 1) can be compared to bit 4 of the stored data vectors 404 by applying the voltage differential VDM2 to each memory cell coupled to bit line 420-6, and Bit7 of the input vector 402 (e.g., input state 1) can be compared to bit 7 of the stored data vectors 404 by applying the voltage differential VDM2 to each memory cell coupled to bit line 420-7. In some examples, the voltage differential VDM2 may be applied concurrently to (e.g., in parallel with) one or more memory cells coupled to bit lines 420-2, 420-3, 420-6, and 420-7 during a second phase (e.g., time period), as shown in FIG. 4. For example, Bit2, Bit3, Bit6, and Bit7 of the input vector 402 may be compared concurrently (e.g., in parallel) to bit 0, bit 1, bit 4, and bit 5, respectively, of the stored vectors 404 during the second phase.

In some examples, the voltage differential VDMZ may be applied concurrently to one or more memory cells coupled to bit lines 420-2, 420-3, 420-6, and 420-7 during the first phase while VDM1 is being applied concurrently (e.g., in parallel) to one or more memory cells coupled to bit lines 420-0, 420-1, 420-4, and 420-5, as shown in FIG. 4. During the second phase, the voltage differential VDMZ may be applied to concurrently to one or more memory cells coupled to bit lines 420-0, 420-1, 420-4, and 420-5 while the voltage differential VDM2 may be applied concurrently to one or more memory cells coupled to bit lines 420-2 420-3, 420-6, and 420-7. In other examples, the comparisons described in FIG. 4 may occur in a single phase in which VDM1 is applied to bit lines 420-0, 420-1, 420-4, and 420-5 (e.g., those bit lines coupled to cells whose stored data value is to be compared to input state 0) concurrently with VDM2 being applied to bit lines 420-2, 420-3, 420-6, and 420-7 (e.g., those bit lines coupled to cells whose stored data value is to be compared to input state 1).

For a stored vector 404 to match input vector 402, each respective bit value stored in that vector must match a corresponding one of the bit values in input vector 402 (e.g., all the bit values Bit0 through Bit7 of input vector 402 must match the bit values of respective bits 0 through 7 of the stored vector 404). As described above, in a number of embodiments, a match between a value of a bit of input vector 402 and a bit value stored by a memory cell may be determined by not sensing a snapback in response to the applied voltage differential (e.g., VDM1 or VDM2 depending on whether the input state being compared is state 0 or state 1). A mismatch between an input bit value and a bit value stored by a memory cell may be determined by sensing a snapback in response to the applied voltage differential.

In a number of embodiments, detection circuits (e.g., sense amplifiers) coupled to the word lines and/or bit lines of an array can be configured to latch a particular data value (e.g., "0") responsive to sensing a snapback event on a corresponding signal line (e.g., word line or bit line) and to latch another data value (e.g., "1") responsive to not sensing a snapback event on the corresponding signal line. For instance, in the example of FIG. 4, the detection circuits coupled to the word lines 410 include respective sense amplifiers 430 and corresponding latches 440. In this example, a latched value of "1" indicates no snapback event was detected on the word line, and a latched value of "0" indicates that a snapback event was detected on the word line. Therefore, the comparison operation described in FIG. 4 results in only latch 440-4 storing a "1," since stored vector 404-4 (e.g., 00110011) is the only one of stored vectors 404 that matches the input vector 402 (e.g., 00110011). It is noted that, each of the other stored vectors 404 include at least one bit whose value does not match the corresponding bit of the input vector 402. Accordingly, the detection circuits coupled to each of the other word lines 410 (e.g., all word lines except for word line 410-4) will detect at least one snapback event during the comparison operation and will therefore latch a "0" as shown in FIG. 4 (e.g., to indicate at least one mismatch).

As described further below, in a number of embodiments, the detection circuits can provide a feedback signal (e.g., to a driver) in response to the snapback of a memory cell (e.g., in response to sensing a snapback event) in order to prevent further current flow through the word line, which may prevent other memory cells coupled to the word line from snapping back. Preventing further current flow through a word line responsive to sensing a snapback event can conserve power, and reduce sensing time, among other benefits. For example, in the comparison operation described in FIG. 4, a snapback of any one cell coupled to a particular word line 410 results in a determined mismatch for the corresponding stored vector 404. Once a mismatch is determined (e.g., via sensing of a single snapback event), further current flow through the corresponding word line is unnecessary.

In some examples, the configuration in FIG. 4 may operate as a content addressable memory (CAM), such as a ternary content addressable memory (TCAM) (e.g., owing to the ability of the memory cells to implement ternary functions). In other examples, the configuration in FIG. 4 may operate as a Hopfield network, a spiking network, and/or a sparse distributed memory.

Figure 5:
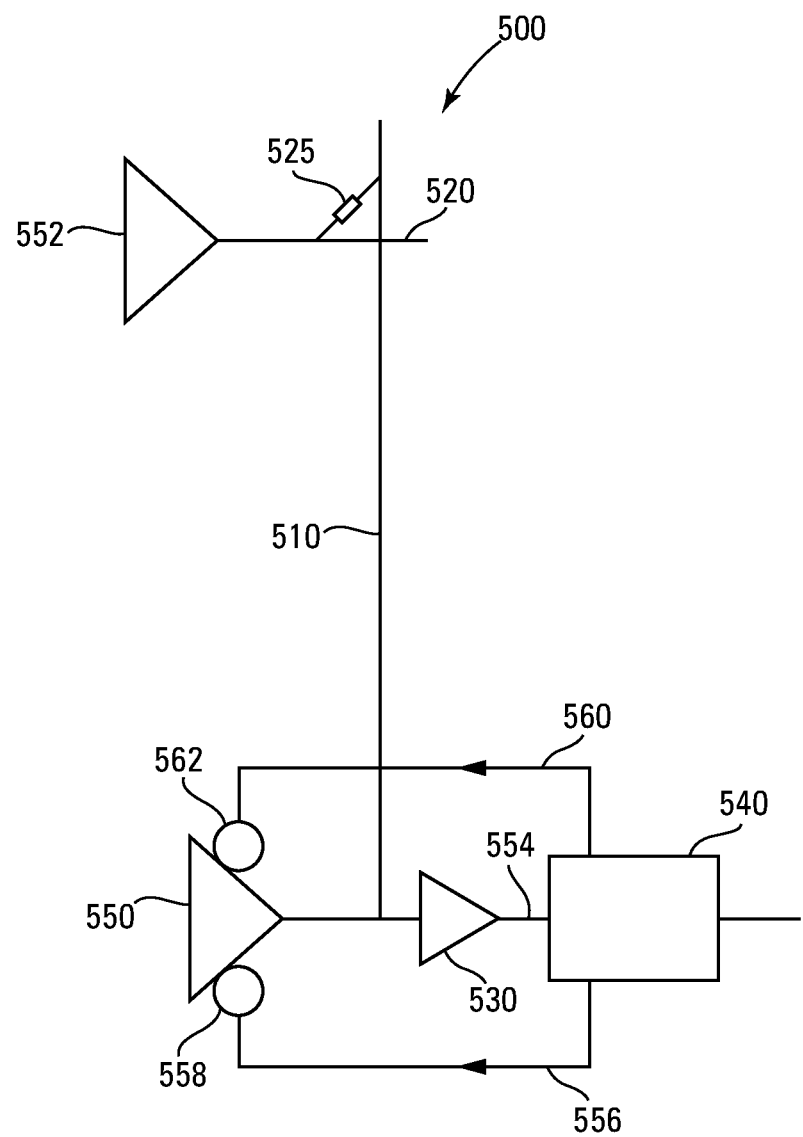
FIG. 5 illustrates an example of a portion of a memory array and associated circuitry, in accordance with a number of embodiments of the present disclosure.

FIG. 5 illustrates an example of a portion of a memory array 500 and associated detection circuitry for performing comparison operations in accordance with a number of embodiments of the present disclosure. Memory array 500 may be a portion of memory array 100 and/or memory array 400. Memory cell 525 is coupled to a word line 510 and a bit line 520 and may be operated as described herein.

The example shown in FIG. 5 includes a driver 550 (e.g., a word line driver 550) coupled to word line 510. Word line driver 550 may supply bi-polar (e.g., positive and negative) current and/or voltage signals to word line 510. A sense amplifier 530, which may comprise a cross-coupled latch, is coupled to word line driver 550, and may detect positive and negative currents and/or positive and negative voltages on word line 510. In some examples, sense amplifier 530 may be part of (e.g., included in) word line driver 550. For example, the word line driver 550 may include the sensing functionality of sense amplifier 530. A bit line driver 552 is coupled to bit line 520 to supply positive and/or negative current and/or voltage signals to bit line 520.

The sense amplifier 530 and word line driver 550 are coupled to a latch 540, which can be used to store a data value indicating whether or not a snapback event of cell 525 has occurred responsive to an applied voltage differential. For instance, an output signal 554 of sense amplifier 530 is coupled to latch 540 such that responsive to detection, via sense amplifier 530, of memory cell 525 snapping back, the output signal 554 causes the appropriate data value to be latched in latch 540 (e.g., a data value of "1" or "0" depending on which data value is used to indicate a detected snapback event). As an example, if a latched data value of "1" is used to indicate a detected snapback event, then signal 554 will cause latch 540 to latch a data value of logical 1 responsive to a detected snapback of cell 525, and vice versa.

When a positive voltage differential VDM1 (e.g., corresponding to an input state 0) is applied to memory cell 525 (e.g., the word line voltage VWL1 is low and the bit line voltage VBL1 is high) and memory cell 525 stores state 1, voltage differential VDM1 may be greater than the threshold voltage Vtst12 (FIG. 2C), and memory cell 525 may snap back to a conductive state, causing the positive current flow, shown in FIG. 2C, through memory cell 525 from bit line 520 to word line 510. Sense amplifier 530 may detect this current, and/or a voltage associated therewith, for example, and may output signal 554 to latch 540 in response to detecting this current and/or voltage. For example, signal 554 may indicate to latch 540 (e.g., by having a logical low value) that current is positive, and thus that word line voltage is low. In response to the signal 554 indicating that the word line voltage is low, latch 540 may output a signal 556 (e.g. voltage) to circuitry 558 of or coupled to word line driver 550 that turns off (e.g., inhibits) the current flow through word line 510, and thus through memory cell 525.

In examples, when a negative voltage differential VDM2 (e.g., corresponding to an input state 1) is applied to memory cell 525 (e.g., the word line voltage VWL2 is high and the bit line voltage VBL2 is low) and memory cell 525 stores state 0, voltage differential VDM2 is greater (in a negative sense) than the threshold voltage Vtst01 (FIG. 2B), and memory cell 525 may snap back to a conductive state, causing the negative current flow, shown in FIG. 2B, through memory cell 525 from word line 510 to bit line 520. Sense amplifier 530 may detect this current, and/or a voltage associated therewith, for example, and may output the signal 554 to latch 540 in response to detecting this current and/or a voltage. For example, signal 554 may indicate to latch 540 that current is negative (e.g., by having a logical high value), and thus that word line voltage is high. In response to the signal 554 indicating that the word line voltage is high, latch 540 may output a signal 560 (e.g. voltage) to circuitry 562 of or coupled to word line driver 550 that turns off the current flow through word line 510. In some examples, sense amplifier 530 in combination with circuitries 558 and 562 may be referred to as detection circuitry.

Figure 6:
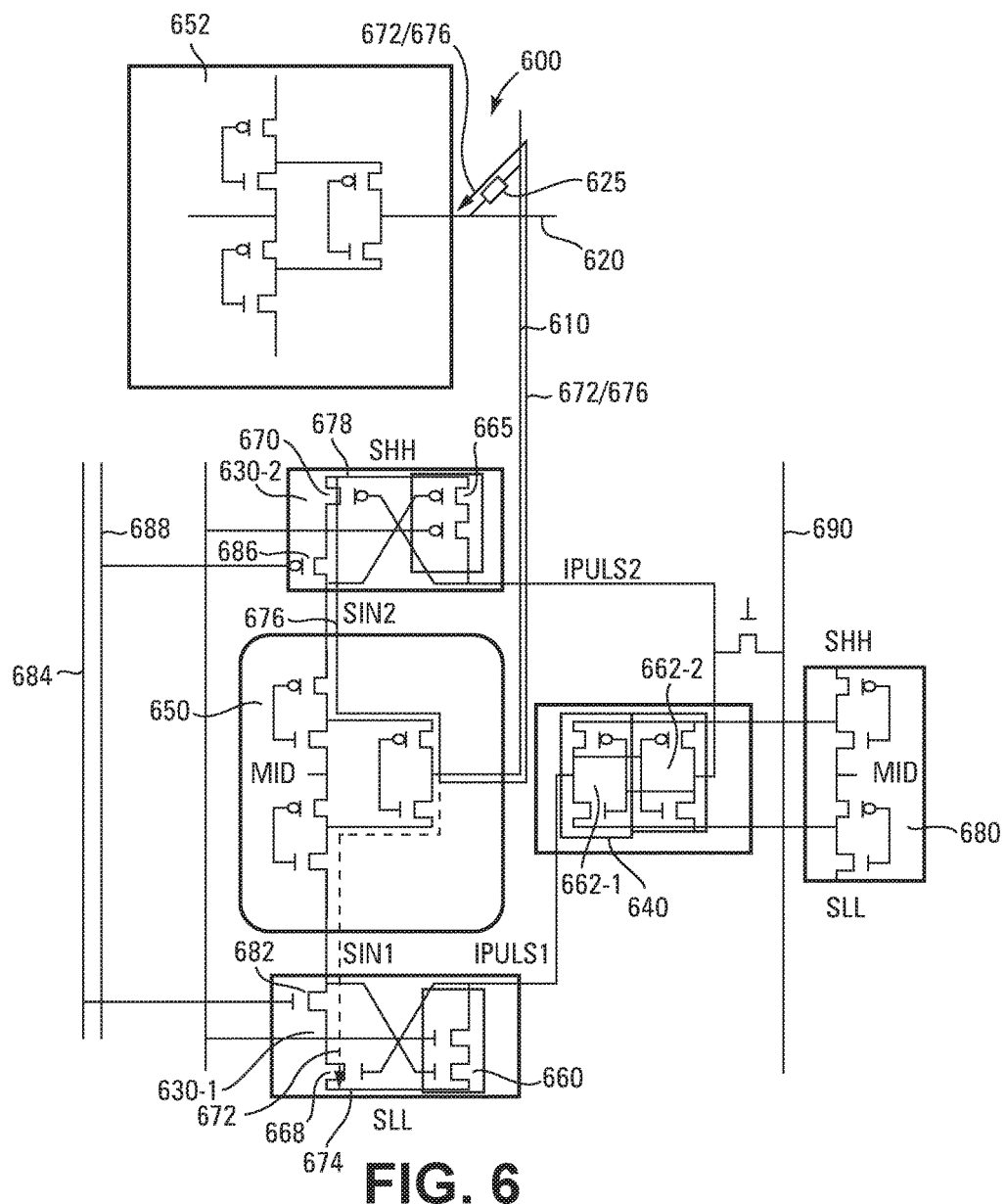
FIG. 6 illustrates another example of a portion of a memory array and associated circuitry, in accordance with a number of embodiments of the present disclosure.

FIG. 6 illustrates an example of a portion of a memory array 600 and associated detection circuitry for performing comparison operations (e.g. for detecting and recording snapback) in accordance with a number of embodiments of the present disclosure. Memory array 600 may be a portion of memory array 100 and/or memory array 400. A memory cell 625 is coupled to word line 610 and a bit line 620 and may be operated as described herein.

A word line driver 650 is coupled to word line 610, and a bit line driver 652 is coupled to bit line 620. Word line driver 650 outputs a signal (e.g., a voltage) SIN1 to sense amplifier 630-1 (e.g., a detector) and a signal (e.g., a voltage) SIN2 to sense amplifier 630-2. A latch 640 is coupled to feedback circuitries (e.g., sense amplifiers) 630-1 and 630-2. Sense amplifier 630-1 generates and outputs a signal (e.g., a voltage) IPULS1 to latch 640, and sense amplifier 630-2 generates and outputs a signal (e.g., a voltage) IPULS2 to latch 640. In some examples, latch 640 has a static-random-access-memory (SRAM) configuration.

In some examples, sense amplifiers 630-1 and 630-2 are feedback latches, such as cross-coupled latches, that operate as inverters. For example, when the input to sense amplifier 630-1, SIN1, is high, the output of sense amplifier 630-1, IPULS1, may be low and vice versa. When the input to sense amplifier 630-2, SIN2, is low, the output of sense amplifier 630-2, IPULS2, is high and vice versa.

Circuitry (e.g., transistors) 660 of sense amplifier 630-1 in combination with circuitry (e.g., transistors) 662-1 of latch 640 acts as a comparator, for example, where transistors 660 act as a pull-down and circuitry (e.g., transistors) 662-1 may act as a load. Circuitry (e.g., transistors) 665 of sense amplifier 630-2 in combination with circuitry (e.g., transistors) 662-2 of latch 640 act as a comparator, for example, where transistors 665 may act as a pull-up and transistors 662-2 may act as a load.

The signals IPULS1 and IPULS2 also act as feedback signals that act to turn off the current to word line 610. For example, when the signal SIN1 is high, the signal IPULS1 is low and causes a transistor 668 of sense amplifier 630-1 to turn off, and thus turn off current flow to word line 610, and thus to memory cell 625. For example, transistor 668, and thus sense amplifier 630-1, are configured to selectively decouple (e.g., electrically isolate) node 674 from word line 610 in response to signal IPULS1 going low. When the signal SIN2 is low, the signal IPULS2 is high and may cause a transistor 670 of sense amplifier 630-2 to turn off, and thus turn off current flow to word line 610. For example, transistor 670, and thus sense amplifier 630-2, are configured to selectively decouple node 678 from word line 610 in response to signal IPULS2 going high.

In an example, when the signal IPULS1 is low, it causes data in latch 640 to change its value (e.g., from a logical 1 to a logical 0), and when the signal IPULS2 is high, it causes data in latch 640 to change its value (e.g., from a logical 1 to a logical 0).

When a positive voltage differential VDM1 (e.g., corresponding to an input state 0) is applied to memory cell 625 (e.g., the word line voltage VWL1 is low and the bit line voltage VBL1 is high) and memory cell 625 stores state 1, voltage differential VDM1 is greater than the threshold voltage Vtst12 (FIG. 2C), and memory cell 625 snaps back to a conductive state, causing the positive current flow, shown in FIG. 2C, through memory cell 625 from bit line 620 to word line 610.

Arrow 672 in FIG. 6 shows an example of the current path in response to memory cell 625 snapping back in response to voltage differential VDM1. In general, the current flows from bit line 620, through memory cell 625, and to word line 610. The current flows through word line 610 to word line driver 650 and from word line driver 650 to a (e.g., low) voltage node 674 that may be at a voltage SLL, such as ground. For example, the word line voltage VWL1 may be at the voltage SLL.

The snapback of memory cell 625 in response to voltage differential VDM1 causes the signal SIN1 (e.g., that may be low initially) to be (e.g., to go) high. Sense amplifier 630-1 causes the signal IPULS1 (e.g., that may be high initially) to be (e.g., to go) low. The low value of IPULS1 may cause latch 640 to store (e.g., to latch) a logical 0, indicative of memory cell 625 snapping back. The low value of IPULS1 (e.g., operating as a feedback signal) also causes transistor 668 to turn off the current flow to word line 610. Transistor 668 may be on initially, for example, in response to IPULS1 being high initially.

For example, to apply VDM1 to memory cell 625, driver 650 and sense amplifier 630-1 couple node 674 and the voltage SLL to word line 610 while a voltage greater than voltage SLL is applied to bit line 620. In response to memory cell 625 snapping back, current initially flows from bit line 620 to node 674 until SIN1 goes high (e.g., in response to the word line voltage going high responsive to memory cell 625 snapping back) and IPULS1 goes low and causes sense amplifier 630-1 to decouple node 674 from word line 610.

In examples, when a negative voltage differential VDM2 (e.g., corresponding to an input state 1) is applied to memory cell 625 (e.g., the word line voltage VWL2 is high and the bit line voltage VBL2 is low) and memory cell 625 stores state 0, voltage differential VDM2 is greater in a negative sense than the threshold voltage Vtst01 (FIG. 2B), and memory cell 625 snaps back to a conductive state, causing the negative current flow, shown in FIG. 2B, through memory cell 625 from word line 610 to bit line 620.

Arrow 676 shows an example of the current path in response to memory cell 625 snapping back (e.g., in response to application of VDM2 across the cell with the word line voltage being high). In general, the current flows from a (e.g., high) voltage node 678 that is at a voltage SHH to word line driver 650, from word line driver 650 to word line 610, and from word line 610 to memory cell 625. The current may flow from word line 610 through memory cell 625 to bit line 620. In some examples, the word line voltage VWL2 might be at the voltage SHH.

The snapback of memory cell 625 in response to voltage differential VDM2 may cause the signal SIN2 (e.g., initially high) to be (e.g., to go) low. Sense amplifier 630-2 may cause the signal IPULS2 (e.g., that may be low initially) to be (e.g., to go) high. The high value of IPULS2 may cause latch 640 to store (e.g., to latch) a logical 0, indicative of memory cell 625 snapping back. The high value of IPULS2 (e.g., operating as a feedback signal) may also cause transistor 670 to turn off the current flow to word line 610. Transistor 670 may be on initially, for example, in response to IPULS2 being low initially.

For example, to apply VDM2 to memory cell 625, driver 650 and sense amplifier 630-2 may couple node 678 and the voltage SHH to word line 610 while a voltage less than the voltage SHH is applied to bit line 620. In response to memory cell 625 snapping back, current may initially flow from node 678 to bit line 620 until SIN2 goes low (e.g., in response to the word line voltage going high in a negative sense responsive to memory cell 625 snapping back) and IPULS2 goes high and causes sense amplifier 630-2 to decouple node 678 from word line 610.

Switching circuitry 680 may be used to set the operating ranges of latch 640. For example, switching circuitry 680 may set the operating range of latch 640 to be between the voltage SLL and a voltage MID, which may be midway between the voltage SLL and SHH, in response to applying the voltage differential VDM1 to memory cell 625 when the word line voltage is low. Switching circuitry 680 may, for example, set the operating range of latch 640 to be between the voltage MID and the voltage SHH in response to applying the voltage differential VDM2 to memory cell 625 when the word line voltage is high. In some examples, switching circuitry 680 may be coupled to the latches that may be coupled to other word lines. For example, latches 440-0 to 440-7 in FIG. 4 may be commonly coupled to switching circuitry 680. In some examples, the sensing circuitry that may include sense amplifiers 630-1 and 630-2 in combination with latch 640 may further include switching circuitry 680.

A transistor 682, such as a current-setting transistor, of sense amplifier 630-1 may be used to control (e.g., limit) the current flow in word line 610, and thus through memory cell 625, in response to signals (e.g., voltages) from a line 684 when the word line voltage is low. A transistor 686, such as a current-setting transistor, of sense amplifier 630-2 may be used to control (e.g., limit) the current flow in word line 610 in response to signals (e.g., voltages) from a line 688 when the word line voltage is high. A line 690 may be used to convey the data stored in latch 640 to input/output circuitry, such as I/O circuitry 1212 in FIG. 12.

In some examples, transistors 668 and 682 in combination may be referred to as circuitry of sense amplifier 630-1, and transistors 670 and 686 in combination may be referred to as circuitry of sense amplifier 630-2. In some examples, the transistors in sense amplifier 630-1 may be n-channel transistors and the transistors in sense amplifier 630-2 may be p-channel transistors. Driver 650 may be configured to selectively couple word line 610 to sense amplifiers 630-1 and 630-2, for example.

Figure 7A:
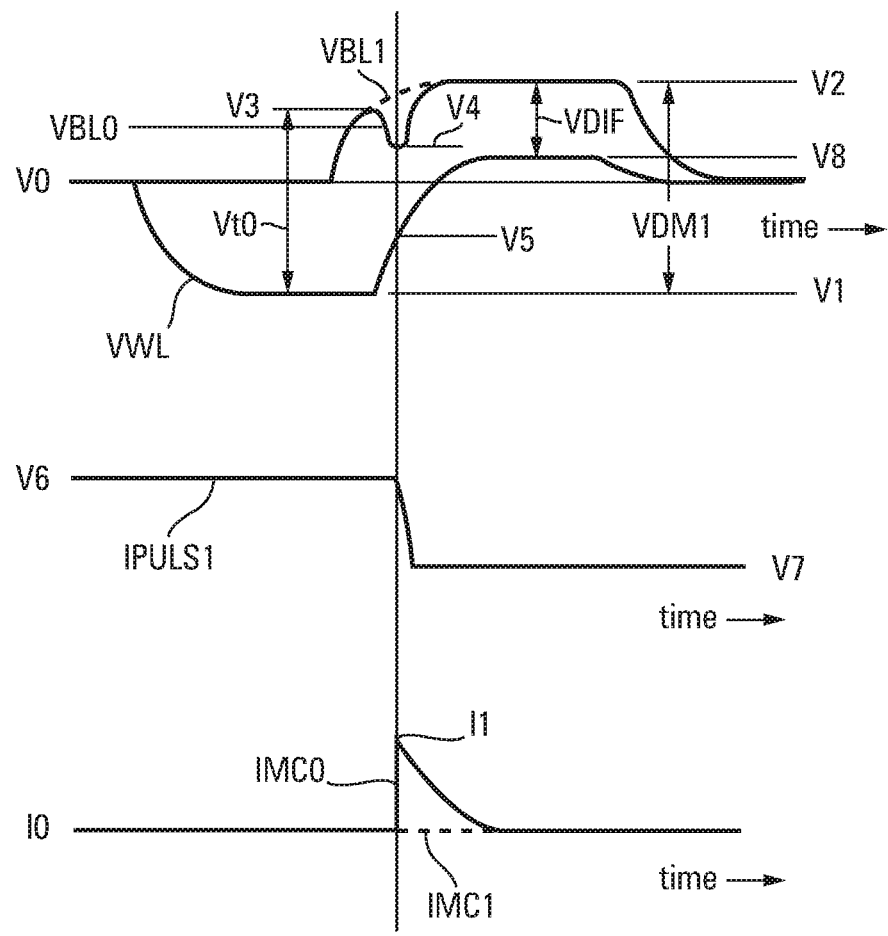
FIG. 7A presents example timing diagrams, in accordance with a number of embodiments of the present disclosure.
Figure 7B:
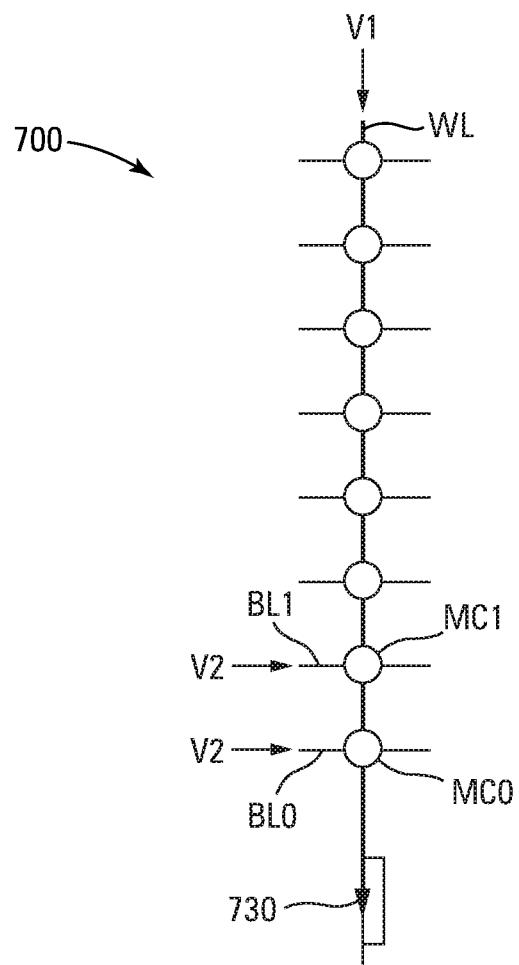
FIG. 7B shows an operation being performed on a portion of a memory array, in accordance with a number of embodiments of the present disclosure.

FIG. 7A presents example timing diagrams associated with performing comparison operations (e.g., that may include sensing operations) in accordance with a number of embodiments of the present disclosure. FIG. 7B is an example of a portion of a memory array 700 on which an operation is being performed, and may be a portion of memory array 100 or memory array 400, in accordance with a number of embodiments of the present disclosure. The timing diagrams in FIG. 7A can correspond to an operation performed on the array of FIG. 7B (e.g., an operation in which a voltage V1 is applied to the word line WL and a voltage V2 is applied to each of the bit lines BL0 and BL1).

FIGS. 7A and 7B are used to illustrate an example of turning off current to a memory cell, and thus to a word line, in response to detecting a mismatch between data in only one memory cell coupled to a word line. For example, the current to the word line may be turned off in response to detecting the snapback of the first memory cell of a group of memory cells commonly coupled to the word line to snap back. This, for example, may take advantage of the possibility that memory cells that might store the same data state might have slightly different threshold voltages (e.g., that may be within the threshold distribution for that data state) that might be less than an input voltage differential applied to those memory cells. For example, the memory cells may snapback at different times in response to the same input voltage differential. In some examples, the first memory cell to snap back might be the memory cell with the lowest threshold voltage, and the current to the word line might be turned off in response to detecting the snapback of that memory cell, thereby avoiding the need to detect the snapback of other memory cells. This may act to reduce the power consumption associated with not turning the current to the word line off after detecting a single snapback.

In some examples, the input voltage differential may be variable. For example, the input voltage differential may be a ramp voltage differential that may, for example, increase in magnitude (e.g., at a constant rate) from a ground voltage (e.g., zero volts) to a voltage that is greater in magnitude than a highest expected threshold voltage of the memory cells. In other examples, the variable input voltage may be a ramped input voltage differential comprising a series of increasing (e.g., in magnitude) differential voltage pulses.

In the examples of FIGS. 7A and 7B, a memory cell MC0 at a crossing of word line WL and bit line BL0 may be programmed to a threshold voltage Vt0 (e.g., about 5.0 volts), and memory cell MC1 at a crossing of word line WL and bit line BL1 may be programmed to a threshold voltage Vt1 (e.g., about 5.1 volts) that is greater than threshold voltage Vt0. Memory cells MC0 and MC1 may be similar to (e.g., the same as) memory cells 125. For example, memory cells MC0 and MC1 may be programmed to the state 1 shown in FIGS. 2A and 2C. The threshold voltages Vt0 and Vt1 may be in the threshold-voltage distribution 201-2, corresponding the positive state 1, shown in FIG. 2A, for example.

Initially, word line WL and bit lines BL0 and BL1 may be at a voltage V0 (e.g., about 3.5 volts), so the voltage differential between bit line BL0 and word line WL, and thus applied to memory cell MC0, and the voltage differential between bit line BL1 and word line WL, and thus applied to memory cell MC1, may initially be about zero (0) volt. A voltage (e.g. level) V1 may then be applied to word line WL. The word line voltage signal VWL may represent the instantaneous word line voltage of word line WL. For example, the voltage signal VWL may decrease from the initial voltage V0 to the voltage V1 in response to applying V1 to word line WL.

A voltage V2 (e.g., about 5.5 volts) may be applied to bit lines BL0 and BL1 concurrently (e.g., after applying voltage V1 to word line WL). However, the present disclosure is not limited to applying the voltage V2 after applying the voltage V1. For example, the voltages V1 and V2 might be applied at the same time or voltage V2 might be applied before voltage V1.

The voltage differential VDM1, such as a sensing voltage differential, between bit line BL0 and word line WL, and thus applied to memory cell MC0, may be VDM1=V2−V1 (e.g., about 5.5 volts). The voltage differential VDM1 may also be between bit line BL1 and word line WL, and thus may be applied to memory cell MC1. In some examples, voltage V2 may be a variable voltage of increasing magnitude, such as a ramp voltage of increasing magnitude or a series of voltage pulses of increasing magnitude. For example, voltage V2 may have an initial value equal to the voltage V1. Therefore, the voltage differential VDM1 may be a ramp voltage differential of increasing magnitude or a series of increasing differential voltage pulses of increasing magnitude (e.g., having a starting voltage of zero volts). FIGS. 7A and 7B may depict a sensing operation, where a sensing differential, such as voltage differential VDM1, is applied to memory cells MC0 and MC1 commonly coupled to a word line WL and respectively coupled to bit lines BL0 and BL1.

The example of FIGS. 7A and 7B may depict a comparison operation where VDM1 corresponds to a positive input state 0 compared to positive states 1 stored in memory cells MC0 and MC1. For example, input states (e.g., data) may correspond to components of an input vector and the states stored by memory cells MC0 and MC1 are components of a stored vector being compared to the input vector. Timing diagrams similar to those in FIG. 7A may depict a comparison operation where a negative input state 1 might be compared to negative states 0 stored in memory cells MC0 and MC1 by applying VDM2 (FIG. 2A) to memory cells MC0 and MC1.

The voltage differential VDM1 may be greater than the threshold voltage Vt0 of memory cell MC0 and the threshold voltage Vt1 of memory cell MC1, for example, and thus may cause memory cells MC0 and MC1 to snap back. The threshold voltages of the memory cells at crossings of the remaining bit lines and the word line may be greater than the voltage differential VDM1. In examples, the voltage differential VDM1 may be increased from zero volt to threshold voltage Vt0 and to the threshold voltage Vt1 (e.g., by increasing the voltage V2).

A bit line voltage signal VBL0 may represent the instantaneous bit line voltage of bit line BL0, and a bit line voltage signal VBL1 may represent the instantaneous bit line voltage of bit line BL1. For example, voltage signals VBL0 and VBL1 may increase concurrently from the voltage V0 to a voltage V3 in response to applying the voltage V2 to bit lines BL0 and BL1. For example, the difference VBL0−VWL may be the instantaneous voltage differential across memory cell MC0, and the difference VBL1−VWL may be the instantaneous voltage differential across memory cell MC1.

The threshold voltage Vt0 of memory cell MC0 may, for example, be Vt0=V3−V1 (e.g., about 5 volts) that may be less than voltage differential VDM1. The current signal IMC0, representative of the instantaneous current flow through memory cell MC0, and the current signal IMC1, representative of the instantaneous current flow through memory cell MC1, may remain at a current I0 (e.g., about 0 amp) while (e.g., during the time) the word line voltage signal VWL decreases to the voltage V1 and while (e.g., during the time) the bit line voltage signals VBL0 and VBL1 increase to the voltage V3. For example, this may be because during these times memory cells MC0 and MC1 are off (e.g., are in their non-conductive states).

The voltage signal IPULS1 in FIG. 7A may be the output voltage signal of sensing circuitry 730 coupled to word line WL in FIG. 7B. Sensing circuitry 730 may be similar to (e.g., the same as) the sensing circuitry described previously in conjunction with FIG. 5 and/or FIG. 6. For example, the voltage signal IPULS1 may remain at an initial preset voltage V6 (e.g., about 3.5 volts), corresponding to a logical 1, while the word line voltage signal VWL decreases to the voltage V1 and while the bit line voltage signals VBL0 and VBL1 increase to the voltage V3.

Memory cell MC0 may snap back in response to the bit line voltage signal VBL0 reaching the voltage V3 while the word line voltage signal VWL is at the voltage V1. In response to memory cell MC0 snapping back, the bit line voltage signal VBL0 may decrease from voltage V3 to a voltage V4 (e.g., about 4.5 volts); the word line voltage signal VWL may increase from voltage V1 to a voltage V5 (e.g., about one (1) volt) while the bit line voltage VBL0 decreases from voltage V3 to voltage V4; and the current signal IMC0 may increase from the current I0 to a current I1. Note, for example, that as described previously in conjunction with FIG. 2C, the voltage differential across a memory cell may decrease and the current may increase as a result of the memory cell snapping back.

The voltage signal IPULS1 may decrease from the voltage V6 to a voltage V7 (e.g., about 0 volts), such as a logic 0, in response to sensing circuitry 730 detecting the increase in the voltage of word line voltage signal VWL. The sensing circuitry 730 may act to turn off the current to word line WL in response to voltage signal IPULS1 decreasing to voltage level V7. For example, sensing circuitry 730 may act to decouple word line WL from a voltage node (e.g., causing word line WL to float).

Turning off the current to word line WL may act to prevent memory cell MC1 from snapping back, for example, when the voltage differential across memory cell MC1 becomes greater than the threshold voltage Vt1 of memory cell MC1, and thus memory cell MC1 may remain off and the current signal IMC1 may remain at the current I0. For example, the comparison between the input data and the data stored in memory cells may be terminated in response to memory cell MC0 snapping back, thus preventing the comparison to the data stored in memory cell MC1.

In some examples, after memory cell MC0 snaps back and the current on word line is turned off, the voltage differential VDIF between bit line BL0 and word line WL, and thus across memory cell MC0, may be VDIF=V2−V8. The voltage differential VDIF may also be between bit line BL1 and word line WL, and thus across memory cell MC1. For example, voltage differential VDIF may be less than the threshold voltages of memory cells MC0 and MC1.

In some examples, when the same voltage differential is applied to memory cells MC0 and MC1, memory cell MC0 may snap back first, in that memory cell MC0 may have a lower threshold voltage than memory cell MC1. The current to word line WL may be turned off to avoid memory cell MC1 from snapping back and to potentially reduce power requirements, for example. In some examples, the voltage applied to word line WL and each of bit lines BL0 and BL1 may be returned to the voltage V0 after sensing.

Figure 8A:
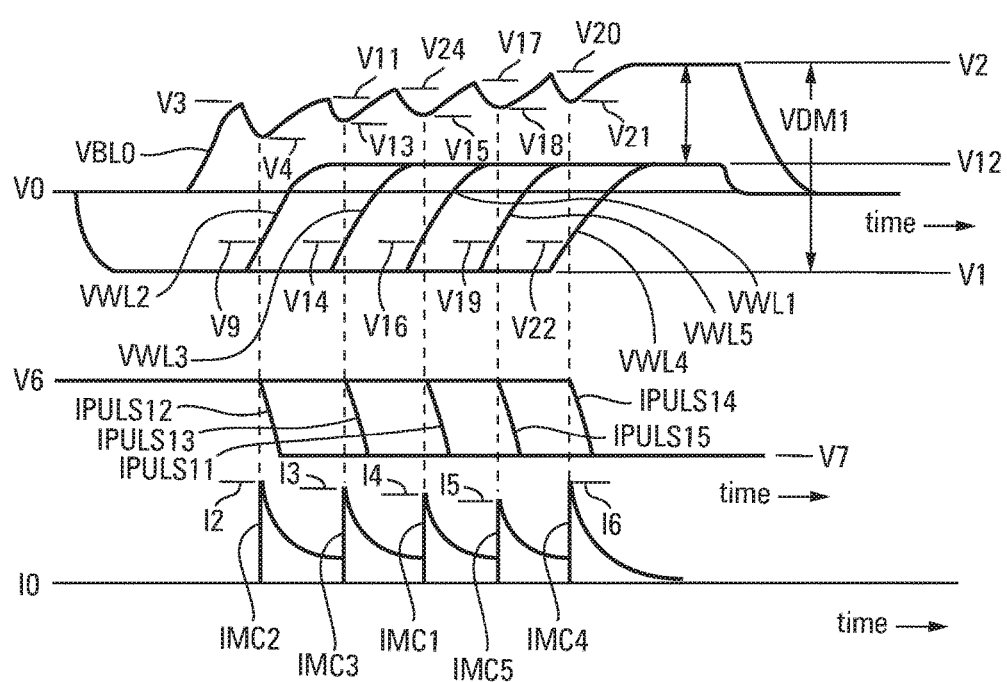
FIG. 8A presents example timing diagrams, in accordance with a number of embodiments of the present disclosure.
Figure 8B:
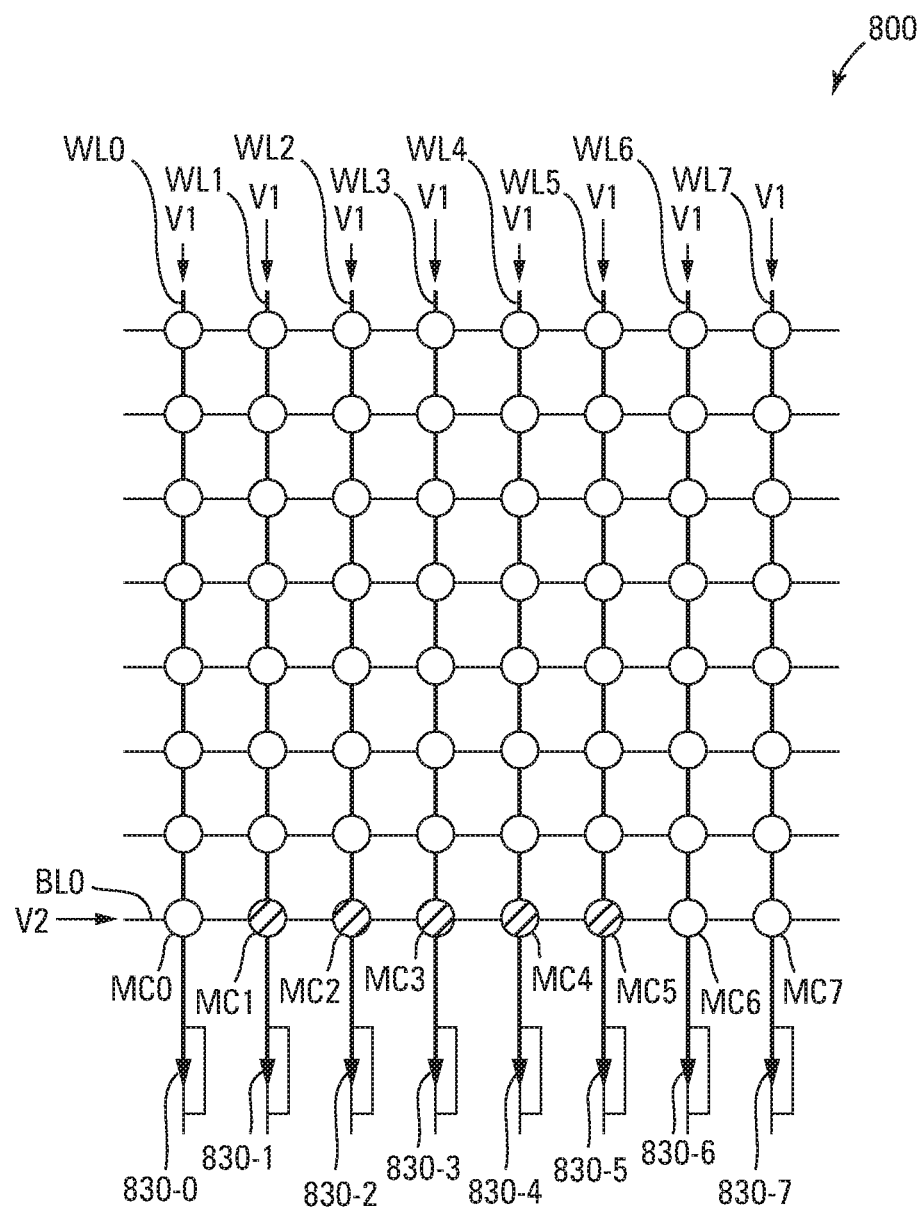
FIG. 8B shows an operation being performed on a portion of a memory array, in accordance with a number of embodiments of the present disclosure.

FIG. 8A presents example timing diagrams (e.g., during a comparison and/or a sensing operation), in accordance with a number of embodiments of the present disclosure. FIG. 8B is an example of an operation, such as a comparison and/or a sensing operation, being performed on a portion of a memory array 800 that may be a portion of memory array 100 or memory array 400, in accordance with a number of embodiments of the present disclosure. The timing diagrams in FIG. 8A are in response to applying a voltage to a bit line BL0 and a voltage to each of word lines WL0 to WL5 that cross bit line BL0 in FIG. 8B.

Memory cells MC0 to MC7 are respectively at crossings of word lines WL0 to WL7 and bit line BL0. Memory cells MC0 to MC7 are respectively coupled to word lines WL0 to WL7 and commonly coupled to bit line BL0. Memory cells MC0 to MC7 may be similar to (e.g., the same as) memory cells 125. Memory cells MC1 to MC5 may be programmed to the positive state 1 shown in FIGS. 2A and 2C and may respectively have threshold voltages Vt1 to Vt5. The threshold voltages Vt1 to Vt5 may be in the threshold-voltage distribution 201-2 shown in FIG. 2A, for example. In some examples, memory cells MC0, MC6, and MC7 may be programmed to positive state 0 shown in FIGS. 2A and 2B and may respectively have threshold voltages Vt0, Vt6, and Vt7. The threshold voltages Vt0, Vt6, and Vt7 may be in the threshold-voltage distribution 200-2 shown in FIG. 2A, for example.

Sensing circuitries 830-0 to 830-7 are respectively coupled to word lines WL0 to WL7. For example, each of sensing circuitries 830-0 to 830-7 may be similar to (e.g., the same as) the sensing circuitry described previously in conjunction with FIG. 5 and/or FIG. 6. A word line driver, such word line driver 550 or 650, is coupled to each sensing circuitry 830 and each word line WL, as described previously, and a bit line driver, such as bit line driver 552 or 652, may be coupled to each bit line BL, as described previously. For example, the setup described in conjunction with FIG. 5 or FIG. 6 may be used with each bit line/word line combination in FIG. 8B.

The word line voltage signals VWL1 to VWL5 in FIG. 8A respectively represent the instantaneous word line voltage of word lines WL1 to WL5. A bit line voltage signal VBL0 represents the instantaneous bit line voltage of bit line BL0. The voltage signals IPULS11 to IPULS15 in FIG. 8A are the output voltage signals of sensing circuitries 830-1 to 830-5. The current signals IMC1 to IMC5 in FIG. 8A respectively represent the instantaneous current flows through memory cells MC1 to MC5.

Initially, word lines WL0 to WL7 and bit line BL0 are at voltage V0, so the voltage differential between bit line BL0 and word lines WL0 to WL7, and thus applied to memory cells MC0 to MC7, is initially about 0 volt. Voltage V1 is then applied to each of word lines WL0 to WL7 concurrently (e.g. in parallel). The example of FIG. 8A focuses on the behavior of word lines WL1 to WL5 respectively coupled to memory cells MC1 to MC5 and the snapback behavior of memory cells MC1 to MC5.

The word line voltage signals VWL1 to VWL5 decreases from the initial voltage V0 to the voltage V1 in response to applying V1 to word lines WL1 to WL5. Although not shown in FIG. 8A, the voltages of word lines WL0, WL6, and WL7 may also decrease from the initial voltage V0 to the voltage V1 in response to applying voltage V1 to word lines WL0, WL6, and WL7.

Voltage V2 is applied to bit line BL0 (e.g., after applying voltage V1 to word lines WL1 to WL7). However, the present disclosure is not limited to applying the voltage V2 after applying the voltage V1. For example, the voltages V1 and V2 might be applied at the same time or voltage V2 might be applied before voltage V1. In some examples, voltage V2 may be a variable voltage of increasing magnitude, such as a ramp voltage of increasing magnitude or a series of increasing voltage pulses of increasing magnitude. For example, voltage V2 may have an initial value equal to the voltage V1.

The voltage differential VDM1 between bit line BL0 and each of word lines WL0 to WL7, and thus applied to memory cells MC0 to MC7, is VDM1=V2−V1. For example, FIGS. 8A and 8B depict a (e.g., pseudo-parallel) sensing scheme, where a sensing voltage differential is applied concurrently to memory cells MC0 to MC7. Similar timing diagrams may depict applying the negative voltage differential VDM2 (FIG. 2A) to memory cells MC0 to MC7. For examples in which voltage V2 may be a variable voltage, the voltage differential VDM1 may be a variable voltage differential of increasing magnitude, such as a ramp voltage differential of increasing magnitude or a series of differential voltage pulses of increasing magnitude (e.g., having a starting voltage of zero volts). For example, the voltage differential VDM1 may be increased (e.g., continuously in the case of a ramp voltage differential) from zero volts until it is greater than the threshold voltage Vt4 of memory cell MC4, the memory cell with highest threshold voltage of memory cells MC1 to MC5, and less than threshold voltages Vt0, Vt6, and Vt7 respectively of memory cells MC0, MC6, and MC7.

The voltage differential VDM1 corresponds to an input state 0, for example. The threshold voltages Vt1 to Vt5 respectively of memory cells MC1 to MC5 are less than voltage differential VDM1 and snap back in response to the voltage differential VDM1. The threshold voltages Vt0, Vt6, and Vt7 respectively of memory cells MC0, MC6, and MC7 are greater than voltage differential VDM1 and do not snap back in response to voltage differential VDM1.

Bit line voltage signal VBL0 increases from voltage V0 to voltage V3 in response to applying voltage V2 to bit line BL0 while word lines WL1 to WL5 are at voltage V1. Memory cell MC2 snaps back in response to the bit line voltage signal VBL0 reaching the voltage V3 while word lines WL1 to WL5 are at voltage V1. For example, the threshold voltage Vt2 of memory cell MC2 is Vt2=V3−V1. In response to memory cell MC2 snapping back, bit line voltage signal VBL0 decreases from voltage V3 to a voltage V4; the word line voltage signal VWL2 increases from voltage V1 to a voltage V9 while the voltage signal VBL0 decreases from voltage V3 to voltage V4; and the current signal IMC2 increases from the current I0 to a current I2. The increase in the current signal IMC2 causes the bit line voltage signal VBL0 to start to increase from voltage V4 to a voltage V11, for example.

The voltage signals IPULS11 to IPULS15 may remain at initial preset voltage V6, while the word line voltage signals VWL1 to VWL5 decrease to the voltage V1 and while the bit line voltage signal VBL0 increases to the voltage V3.

The voltage signal IPULS12 decreases from the voltage V6 to voltage V7 in response to sensing circuitry 830-2 detecting the increase in the voltage of voltage signal VWL2. The sensing circuitry 830-2 acts to turn off the current to word line WL2 in response to voltage signal IPULS12 decreasing to voltage level V7, and thus memory cell MC2 snapping back. For example, sensing circuitry 830-2 acts to decouple word line WL2 from a voltage node (e.g., causing word line WL2 to float). For example, turning off the current to word line WL2 acts to prevent any future snapbacks of memory cell MC2 and may act to reduce power consumption.

In some examples, the threshold voltage of memory cell MC2 is less than the threshold voltages of memory cells MC1 and MC3 to MC5. For example, the threshold voltage of memory cell MC2 is reached before the threshold voltages of memory cells MC1 and MC3 to MC5 are reached, and thus memory cell MC2 snaps back before memory cells MC1 and MC3 to MC5.

In some examples, word line voltage signal VWL2 increases from voltage V9 to a voltage V12 and current signal IMC2 decreases while bit line voltage signal VBL0 increases from voltage V4 to a voltage V11.

Memory cell MC3 snaps back in response to the bit line voltage signal VBL0 reaching the voltage V11 while word lines WL1 and WL3 to WL5 are at voltage V1 and while word line WL2 is at voltage V12. For example, the threshold voltage Vt3 of memory cell MC3 is Vt3=V11−V1.

In response to memory cell MC3 snapping back, bit line voltage signal VBL0 decreases from voltage V11 to a voltage V13; the word line voltage signal VWL3 increases from voltage V1 to a voltage V14 while the bit line voltage signal VBL0 decreases from voltage V11 to voltage V13; and the current signal IMC3 increases from the current I0 to a current I3. For example, the increase to current I3 may cause the bit line voltage signal VBL0 to start to increase from voltage V13 to a voltage V24. In some examples, the current signal IMC2 is cut off and goes to current I0 in response to memory cell MC3 snapping back.

The voltage signals IPULS11, IPULS13, IPULS14, and IPULS15 remain at voltage V6 and voltage signal IPULS12 remains at voltage V7 (e.g., the current to word line WL2 is off) while the bit line voltage signal VBL0 increases to the voltage V11 and subsequently decreases to voltage V13, memory cell MC3 snaps back, and the word line voltage signal VWL2 increases to voltage V12.

The voltage signal IPULS13 decreases from the voltage V6 to voltage V7 in response to sensing circuitry 830-3 detecting the increase in the voltage of word line voltage signal VWL3. The sensing circuitry 830-3 acts to turn off the current to word line WL3 in response to voltage signal IPULS13 decreasing to voltage level V7, and thus memory cell MC3 snapping back. For example, sensing circuitry 830-3 acts to decouple word line WL3 from a voltage node (e.g., causing word line WL3 to float). For example, turning off the current to word line WL3 acts to prevent any future snapbacks of memory cell MC3 and may act to reduce power consumption.

In some examples, the threshold voltage of memory cell MC3 is less than the threshold voltages of memory cells MC1, MC4, and MC5. For example, the threshold voltage of memory cell MC3 is reached before the threshold voltages of memory cells MC1, MC4, and MC5 are reached, and thus memory cell MC3 snaps back before memory cells MC1, MC4, and MC5.

In some examples, word line voltage signal VWL3 increases from voltage V14 to voltage V12 and current signal IMC3 decreases while bit line voltage signal VBL0 increases from voltage V13 to a voltage V24.

Memory cell MC1 snaps back to its conductive state in response to the bit line voltage signal VBL0 reaching the voltage V24 while word lines WL1, WL4, and WL5 are at voltage V1, word line WL2 is at voltage V12, and word line WL3 is increasing to or at voltage V12. For example, the threshold voltage Vt1 of memory cell MC1 may be Vt1=V24−V1.

In response to memory cell MC1 snapping back, bit line voltage signal VBL0 decreases from voltage V24 to a voltage V15; the word line voltage signal VWL1 increases from voltage V1 to a voltage V16 while the bit line voltage signal VBL0 decreases from voltage V24 to voltage V15; and the current signal IMC1 increases from the current I0 to a current I4. For example, the increase to current I4 causes the bit line voltage signal VBL0 to start to increase from voltage V15 to a voltage V17. In some examples, the current signal IMC3 is cut off and goes to current I0 in response to memory cell MC1 snapping back.

The voltage signals IPULS11, IPULS14, and IPULS15 remain at voltage V6 and voltage signals IPULS12 and IPULS13 remain at voltage V7 (e.g., the current to word lines WL2 and WL3 is off) while the bit line voltage signal VBL0 increases to the voltage V24 and subsequently decreases to voltage V15, memory cell MC1 snaps back, and the word line voltage signal VWL3 increases to voltage V12.

The voltage signal IPULS11 decreases from the voltage V6 to voltage V7 in response to sensing circuitry 830-1 detecting the increase in the voltage of word line voltage signal VWL1. The sensing circuitry 830-1 acts to turn off the current to word line WL1 in response to voltage signal IPULS11 decreasing to voltage level V7, and thus memory cell MC1 snapping back. For example, sensing circuitry 830-1 acts to decouple word line WL1 from a voltage node (e.g., causing word line WL1 to float). For example, turning off the current to word line WL1 acts to prevent any future snapbacks of memory cell MC1 and may act to reduce power consumption.

In some examples, the threshold voltage of memory cell MC1 is less than the threshold voltages of memory cells MC4 and MC5. For example, the threshold voltage of memory cell MC1 is reached before the threshold voltages of memory cells MC4 and MC5 are reached, and thus memory cell MC1 snaps back before memory cells MC4 and MC5.

In some examples, word line voltage signal VWL1 increases from voltage V16 to voltage V12 and current signal IMC1 decreases while bit line voltage signal VBL0 increases from voltage V15 to voltage V17.

Memory cell MC5 snaps back in response to the bit line voltage signal VBL0 reaching the voltage V17 while word lines WL4 and WL5 are at voltage V1 and while word lines WL1, WL2, and WL3 are at voltage V12. For example, the threshold voltage Vt5 of memory cell MC5 is Vt5=V17−V1.

In response to memory cell MC5 snapping back, bit line voltage signal VBL0 decreases from voltage V17 to a voltage V18; the word line voltage signal VWL5 increases from voltage V1 to a voltage V19 while the bit line voltage signal VBL0 decreases from voltage V17 to voltage V18; and the current signal IMC5 increases from the current I0 to a current I5. For example, the increase to current I5 causes the bit line voltage signal VBL0 to start to increase from voltage V18 to a voltage V20. In some examples, the current signal IMC1 is cut off and goes to current I0 in response to memory cell MC5 snapping back.

The voltage signals IPULS14 and IPULS15 remain at voltage V6 and voltage signals IPULS11, IPULS12, and IPULS13 remain at voltage V7 (e.g., the current to word lines WL1, WL2, and WL3 is off) while the bit line voltage signal VBL0 increases to the voltage V17 and subsequently decreases to voltage V18, memory cell MC5 snaps back, and the word line voltage signal VWL1 increases to voltage V12.

The voltage signal IPULS15 decreases from the voltage V6 to voltage V7 in response to sensing circuitry 830-5 detecting the increase in the voltage of word line voltage signal VWL5. The sensing circuitry 830-5 acts to turn off the current to word line WL5 in response to voltage signal IPULS15 decreasing to voltage level V7, and thus memory cell MC5 snapping back. For example, sensing circuitry 830-5 acts to decouple word line WL5 from a voltage node (e.g., causing word line WL5 to float). For example, turning off the current to word line WL5 acts to prevent any future snapbacks of memory cell MC5 and may act to reduce power consumption.

In some examples, the threshold voltage of memory cell MC5 is less than the threshold voltage of memory cell MC4. For example, the threshold voltage of memory cell MC5 is reached before the threshold voltage of memory cell MC4 is reached, and thus memory cell MC5 snaps back before memory cell MC4.

In some examples, word line voltage signal VWL5 increases from voltage V19 to voltage V12 and current signal IMC5 decreases while bit line voltage signal VBL0 increases from voltage V18 to a voltage V20.

Memory cell MC4 snaps back to its conductive state in response to the bit line voltage signal VBL0 reaching the voltage V20 while word line WL4 is at voltage V1 and while word lines WL1, WL2, WL3, and WL5 are at voltage V12. For example, the threshold voltage Vt4 of memory cell MC4 is Vt4=V20−V1.

In response to memory cell MC4 snapping back, bit line voltage signal VBL0 decreases from voltage V20 to a voltage V21; the word line voltage signal VWL4 increases from voltage V1 to a voltage V22 while the bit line voltage signal VBL0 decreases from voltage V20 to voltage V21; and the current signal IMC4 increases from the current I0 to a current I6. For example, the increase to current I6 may cause the bit line voltage signal VBL0 to start to increase from voltage V21 to voltage V2. In some examples, the current signal IMC5 is cut off and goes to current I0 in response to memory cell MC4 snapping back.

The voltage signal IPULS14 remains at voltage V6 and voltage signals IPULS11, IPULS12, IPULS13, and IPULS15 remain at voltage V7 (e.g., the current to word lines WL1, WL2, WL3, and WL5 is off) while the bit line voltage signal VBL0 increases to the voltage V20 and subsequently decreases to voltage V21, memory cell MC4 snaps back, and the word line voltage signal VWL5 increases to voltage V12.

The voltage signal IPULS14 decreases from the voltage V6 to voltage V7 in response to sensing circuitry 830-4 detecting the increase in the voltage of word line voltage signal VWL4. The sensing circuitry 830-4 acts to turn off the current to word line WL4 in response to voltage signal IPULS14 decreasing to voltage level V7, and thus memory cell MC4 snapping back. For example, sensing circuitry 830-4 acts to decouple word line WL4 from a voltage node (e.g., causing word line WL4 to float). For example, turning off the current to word line WL4 acts to prevent any future snapbacks of memory cell MC4 and may act to reduce power consumption.

While bit line voltage signal VBL0 increases from voltage V21 to voltage V2, the word line voltage signal VWL4 increases from voltage V22 to voltage V12 and current signal IMC4 decreases from current I6 to current I0.

In some examples, the voltages on word lines WL1 to WL5 go to the voltage V12 while the voltage on bit line BL0 goes to voltage V2 such that the differences between the voltages on word lines WL1 to WL5 and bit line BL0 are V2−V12, which is less than the threshold voltages of memory cells MC1 to MC5. Although the example of FIG. 8A shows that the voltages on word lines WL1 to WL5 go to the common voltage V12, the present disclosure is not so limited, and the voltages on word lines WL1 to WL5 may go voltages that are different than each other such that the differences between those voltages on word lines WL1 to WL5 and the voltage on bit line BL0 are less than the threshold voltages of memory cells MC1 to MC5.

Although not shown in FIG. 8A, voltage signals (e.g., corresponding to instantaneous voltages) on word lines WL0, WL6, and WL7 may decrease from the voltage V0 to V1 in response to applying the voltage V1 to word lines WL0, WL6, and WL7 and may remain at the V1 while the bit line voltage signal VBL0 may behave as shown in the example of FIG. 8A, in that the threshold voltages of memory cells MC0, MC6, and MC7 respectively at the crossings of word lines WL0, WL6, and WL7 and bit line BL0 may be greater than the voltage differential VDM1 and thus do not snap back. For example, the sensing scheme may indicate that memory cells MC0, MC6, and MC7 are in positive state 0, in that these memory cells do not snap back, and the sensing scheme may indicate that memory cells MC1 to MC5 are in state 1, in that these memory cells do snap back. In addition, the memory cells MC0, MC6, and MC7 not snapping back may indicate a match between the input state and the state stored by memory cells MC0, MC6, and MC7, and memory cells MC1 to MC5 snapping back may indicate a mismatch between the input state and the state stored by memory cells MC1 to MC5. In some examples, the voltage signals on all word lines WL0 to WL7 may decrease from the voltage V0 to V1 in response to applying the voltage V1 to word lines WL0 to WL7 and may remain at the V1 while the bit line voltage signal VBL0 may behave as shown in the example of FIG. 8A, in that the threshold voltages of memory cells MC0 to MC7 respectively at the crossings of word lines WL0 to WL7 and bit line BL0 may be greater than the voltage differential VDM1 and thus do not snap back, indicative of a match between the input value and the stored value. Note that FIG. 8A refers to the first phase shown in FIG. 4. Similar considerations to those depicted in FIG. 8A may be applied during the second phase of FIG. 4, for example, with the voltages depicted in FIG. 8A reversed.

In the example of the parallel sensing previously described in conjunction with FIG. 8A, the memory cells MC2, MC3, MC1, MC5, and MC4 are selected one at a time by their respective snapback events. For example, the memory cells MC2, MC3, MC1, MC5, and MC4 are selected one at time in order as a result of their respective threshold voltages (e.g., starting with memory cell MC2 having the lowest threshold voltage (e.g., and/or lowest threshold delay) and ending with memory cell MC4 having the highest threshold voltage (e.g., and/or highest threshold delay). This can prevent more than one cell from snapping back at a time. Detection circuitry (e.g. sensing circuitry) detects the snapback of a respective cell, turns that cell off, and allows the next cell (e.g., with the next highest threshold voltage) to be snapped back. The threshold delay, for example, is the time it takes for a memory cell to snap back in response to an applied voltage. The parallel sensing in the example of FIG. 8A may act to amortize the individual threshold delays of memory cells MC1 to MC5 among memory cells MC1 to MC5.

The increase in the voltages of the word line signals VWL1 to VWL5 in response to the respective memory cells MC1 to MC5 snapping back are, for example, a consequence of the current limiting by the detection circuitry. For example, the current in the respective word lines WL1 to WL5 may increase as a result of the respective memory cells MC1 to MC5 snapping back. When the current in a word line corresponding to one of the memory cells reaches a particular level, for example, the voltage of the word line increases as a result of the current limiting.

Figure 9A:
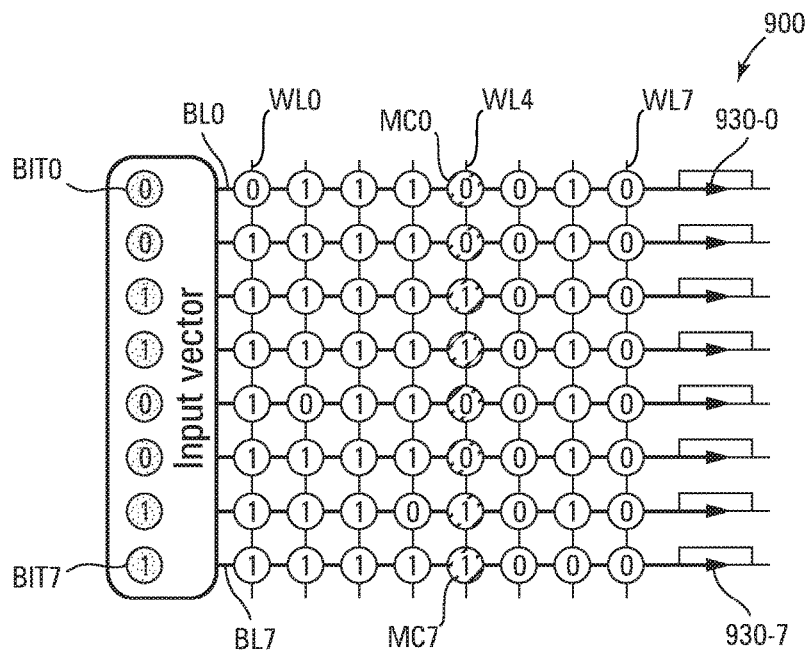
FIG. 9A illustrates an example of data store operation, in accordance with a number of embodiments of the present disclosure.

FIG. 9A illustrates an example of a data store (e.g., a vector store) operation in accordance with a number of embodiments of the present disclosure. For example, an input vector may be stored to a portion of a memory array 900 that may be a portion of memory array 100 or memory array 400. The input vector may be written to memory cells MC0 to MC7 commonly coupled to word line WL4 and respectively coupled to bit lines BL0 to BL7. For example, bit0 to bit7 of the input vector may be respectively written to memory cells MC0 to MC7 to form a stored vector.

Memory cells MC0 to MC7 may be similar to (e.g., the same as) memory cells 125. Sensing circuitries 930-0 to 930-7 are respectively coupled to bit lines BL0 to BL7. Each of the sensing circuitries 930-0 to 930-7 may be similar to sensing circuitries previously described in conjunction with FIG. 5 and/or FIG. 6. For example, the setups shown in FIG. 5 or 6 may be used with memory array 900, but with the word line and the bit line interchanged.

To write a positive state 1 in a memory cell initially in a positive state 0 (e.g., corresponding to threshold-voltage distribution 200-2), such as shown in FIG. 2A, a positive voltage differential VWRITE0 may be applied between the bit line and the word line, and thus to (e.g., across) that memory cell. For example, voltage differential VWRITE0 may be greater than the threshold voltage of the memory cell (e.g., greater than the threshold voltages in the threshold-voltage distribution 200-2 corresponding to positive state 0), as shown in FIG. 2A.

To write a negative state 0 in a memory cell initially in a negative state 1 (e.g., corresponding to a threshold-voltage distribution 201-1), such as shown in FIG. 2A, a negative voltage differential VWRITE1 may be applied between the bit line and the word line, and thus to that memory cell. For example, voltage differential VWRITE1 may be greater in a negative sense than the threshold voltage of the memory cell (e.g., greater in a negative sense than the threshold voltages in threshold-voltage distribution 201-1 corresponding to negative state 0), as shown in FIG. 2A.

Figure 9B:
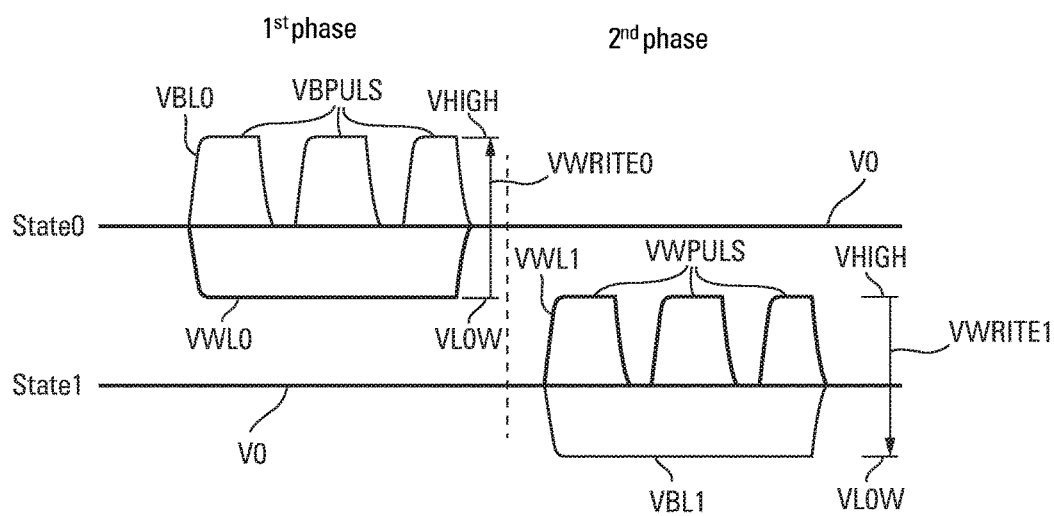
FIG. 9B illustrates examples of write voltages, in accordance with a number of embodiments of the present disclosure.

FIG. 9B illustrates examples of signals, such as write voltages, in accordance with a number of embodiments of the present disclosure. For example, voltage differential VWRITE0 is VWRITE0=VBL0−VWL0, where VBL0 is the bit line voltage applied to the bit line coupled to the memory cell to be written (e.g., programmed) to positive state 1 from positive state 0 and VWL0 is the word line voltage applied to the word line coupled to that memory cell. Voltage differential VWRITE1 is VWRITE1=VBL1−VWL1, for example, where VBL1 is the bit line voltage applied to the bit line coupled to the memory cell to be written (e.g., programmed) to negative state 0 from negative state 1 and VWL1 is the word line voltage applied to the word line coupled to that memory cell.

In the example of FIG. 9B, a signal, such as the word line voltage VWL0, goes to a voltage VLOW (e.g., to about 0 volt) from an intermediate voltage V0 and may, for example, stay at VLOW, while a signal (e.g., a series of voltage pulses VBLPULS) are applied to the bit line coupled to the memory cell to be written. For example, each voltage pulse VBL-PULS has a magnitude of VHIGH−V0. For example, this means that a series of differential voltage pulses VWRITE0 of magnitude VHIGH−VLOW are applied to the memory cells to be written to positive state 1 from positive state 0. This may be accomplished, for example, by applying the series of differential voltage pulses VWRITE0 between the word lines and bit lines between which those memory cells are coupled. In some examples, the differential voltage pulses VWRITE0 are applied to the memory cells to be written to positive state 1 during a first phase, and an inhibit voltage differential (e.g., about zero volt), where VBL0 and VWL0 may be at voltage V0, is applied during a second phase. For example, the writing during the first phase may be performed concurrently (e.g., in parallel, such as to memory cells respectively coupled to different bit lines and commonly coupled to one word line) to the memory cells that are to store positive state 0.

In some examples, a pulse (e.g., each pulse) VWRITE0 causes the memory cell to snap back. In some examples, the sensing circuitry coupled to the bit line coupled to the memory cell may act to cause current to the bit line to be turned off in response to each time the memory cell snaps back. For example, sensing circuitry may act to decouple bit line from a voltage node (e.g., causing bit line to float) in response to each time the memory cell snaps back.

Figure 9C:
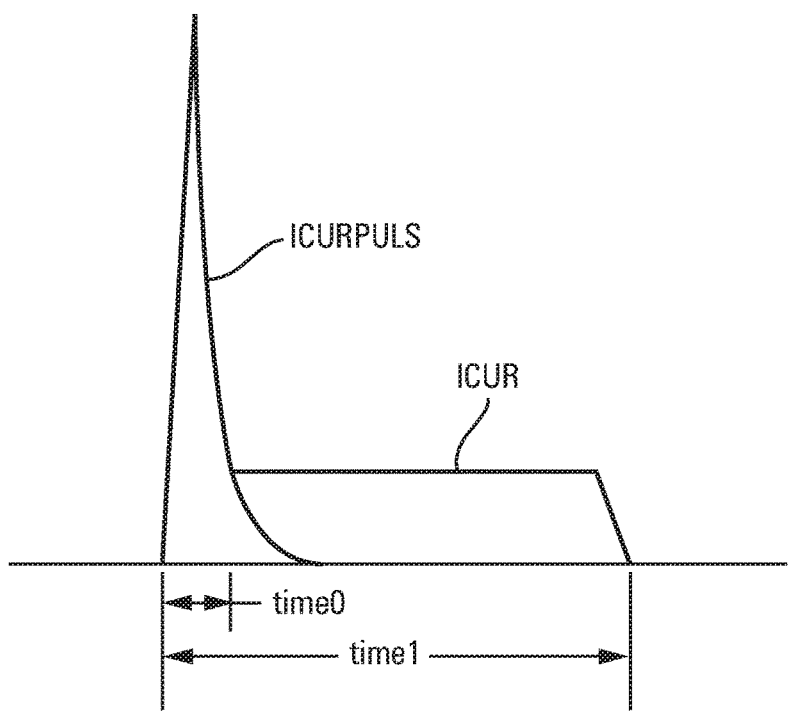
FIG. 9C illustrates an example of a current pulse, in accordance with a number of embodiments of the present disclosure.

Each time the memory cell snaps back, a pulse of current (e.g., a current transient), such as ICURPULS in FIG. 9C, flows (e.g., pulse) through the memory cell. For example, each current pulse ICURPULS may deliver (e.g., impart) energy to the memory cell during a time duration time0 shown in FIG. 9C. In some examples, the number of pulses VWRITE0 may be such that the energy delivered to the memory cell by the corresponding current pulses ICUR-PULS may be sufficient to cause the memory cell to go to positive state 1 from positive state 0. In some examples, the differential write pulses VWRITE0 may be applied until the memory cell is programmed to positive state 1, where each time the memory cell snaps back, it moves toward positive state 1.

In some examples, each snapback event, such as each time a memory cell snaps back (e.g., each time a memory cell goes from a high-impedance state to a lower impedance state), the state of the memory cell may move toward the positive state 1. For example, the state of a memory cell may tend toward state 1 as the memory cell snaps back. In some examples, the number of times a memory cell might need to snap back to go from state 0 to state 1 might be estimated (e.g., based on a number of snapbacks it might take for a sample of memory cells to go from state 0 to state 1). Note, for example, that as the memory cell goes toward state 1 from state 0, its threshold voltage may decrease. In some examples, a memory cell might be sensed (e.g., as described previously) after a certain number of snapbacks to determine whether the memory cell is programmed.

In another example, both the bit line voltage VBL0 and the word line voltage VWL0 may be may be constant (e.g., to within routine variations in the voltages VBL0 and VWL0), meaning that the voltage differential VWRITE0 may be constant. The constant voltage differential VWRITE0 may be applied to the memory cell for a certain time and may cause the memory cell to snapback, resulting in a constant current ICUR (e.g., to within routine variations in the current) through the memory cell, as shown in FIG. 9C. The constant voltage differential VWRITE0 may be applied to the memory cell until the constant current ICUR delivers sufficient energy (e.g., about the same as that delivered by the number of current pulses ICURPULS) to the memory cell so that the memory cell goes to positive state 1. For example, the time duration of the constant current ICUR such that the memory cell goes to positive state 1 may be a time1, as shown in FIG. 9C.

In the example of FIG. 9B, the bit line voltage VBL1 goes to the voltage VLOW and, for example, stays at VLOW, while a series of voltage pulses VWLPULS are applied to the word line. For example, each voltage pulse VWLPULS has a magnitude of VHIGH–V0. For example, this means that a series of differential voltage pulses VWRITE1 of a magnitude VHIGH–VLOW are applied to the memory cells. In some examples, the differential voltage pulses VWRITE1 (e.g., having a polarity opposite to the differential voltage pulses VWRITE0) are applied to memory cells to be programmed to negative state 0 from negative state 1 during the second phase, and an inhibit voltage differential (e.g., about zero volt), where VBL1 and VWL1 may be a voltage V0, is applied during the first phase. For example, the writing during the second phase may be performed concurrently (e.g., in parallel, such as to memory cells respectively coupled to different bit lines and commonly coupled to one word line) to the memory cells that are to store negative state 0. For example, the writing depicted in FIGS. 9A and 9B may be referred to as a pseudo-parallel store to memory cells respectively coupled to different bit lines and commonly coupled to one word line. However, the present disclosure is not limited to applying the differential voltage pulses VWRITE0 and the differential voltage pulses VWRITE1 in different phases, for example.

In some examples, a pulse (e.g., each pulse) VWRITE1 causes the memory cell to snapback. In some examples, the sensing circuitry coupled to the bit line coupled to the memory cell may act to cause current to the bit line to be turned off in response to each time the memory cell snaps back.

Each time the memory cell snaps back a pulse of current (e.g., a current transient) similar to ICURPULS in FIG. 9C, may flow through the memory cell. In some examples, the number of pulses VWRITE1 may be such that the energy delivered to the memory cell by the corresponding current pulses may be sufficient to cause the memory cell to go to negative state 0 from negative state 1. For example, the state of a memory cell may tend toward state 0 in response to a number of times the memory cell snaps back. Note, for example, that as the memory cell goes toward negative state 0 from negative state 1, its threshold voltage may decrease in a negative sense. The sensing circuitry coupled to the bit line coupled to the memory cell that snaps back may output a feedback signal that may act to turn off the current to that bit line in response to that sensing circuitry detecting the snapback (e.g., in a manner similar to that described previously for turning off the word line current in conjunction with FIGS. 6, 7A, and 7B). In some examples, the differential write pulses VWRITE1 may be applied until the memory cell is programmed to negative state 0, where each time the memory cell snaps back, it moves toward negative state 0.

In some examples, the memory cells to be written may be sensed before writing (e.g., using the sensing schemes described previously) to determine whether the memory cells might need to be written. For example, memory cells already in positive state 1 or negative state 0, as indicated by the sensing scheme, might not need to be written.

In some examples, programming a memory cell from a positive state 0 to a positive state 1 or from a negative state 1 to a negative state 0, may cause the magnitude of threshold voltage of the memory cell to decrease.

Figure 10A:
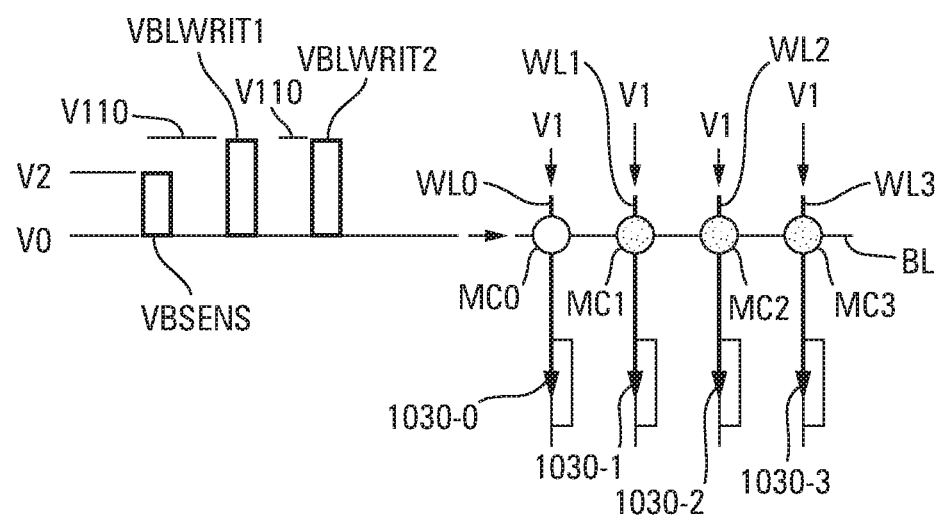
FIG. 10A illustrates another example of a data store operation, in accordance with a number of embodiments of the present disclosure.

FIG. 10A illustrates another example of a data store operation, in accordance with a number of embodiments of the present disclosure. For example, data may be written to memory cells MC0 to MC3 commonly coupled to a bit line BL and respectively coupled to word lines WL0 to WL3. Sensing circuitries 1030-0 to 1030-3 may be respectively coupled to word lines WL0 to WL3. For example, sensing circuitries 1030-0 to 1030-3 may be similar to (e.g., the same as) the sensing circuitry described previously in conjunction with FIG. 5 and/or FIG. 6. A word line driver, such word line driver 550 or 650, is coupled to each sensing circuitry 1030 and each word line WL, as described previously, and a bit line driver, such as bit line driver 552 or 652, is coupled to bit line BL, as described previously. For example, the setup described in conjunction with FIG. 5 or FIG. 6 may be used with each bit line/word line combination in FIG. 10A.

Figure 10B:
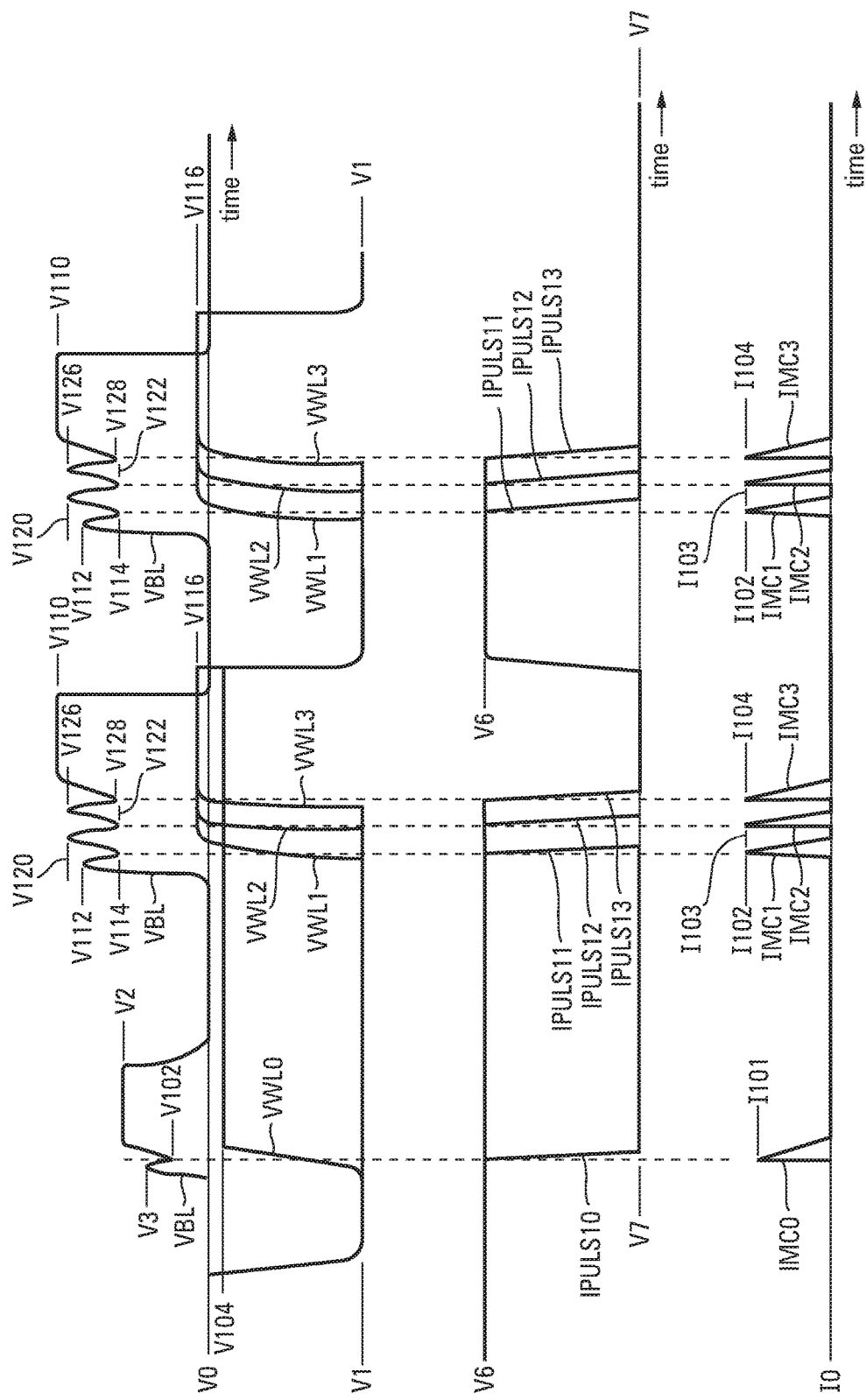
FIG. 10B presents example timing diagrams, in accordance with a number of embodiments of the present disclosure.

In the example of FIG. 10A, it is desired to program memory cells MC1 to MC3 from the positive state 0 in FIG. 2A to the positive state 1 in FIG. 2A. FIG. 10B presents example timing diagrams (e.g., during a data store operation) in accordance with a number of embodiments of the present disclosure. For example, the timing diagrams may correspond to the writing (e.g., programming) in FIG. 10A. Timing diagrams similar to those in FIG. 10B may correspond to programming memory cells MC1 to MC3 from the negative state 1 in FIG. 2A to the negative state 0 in FIG. 2A.

The word line voltage signals VWL0 to VWL3 in FIG. 10B may respectively represent the instantaneous word line voltage of word lines WL0 to WL3. A bit line voltage signal VBL may represent the instantaneous bit line voltage of bit line BL. The voltage signals IPULS10 to IPULS13 in FIG. 10B may respectively be the output voltage signals of sensing circuitries 1030-0 to 1030-3. The current signals IMC0 to IMC3 in FIG. 10B may respectively represent the instantaneous current flows through memory cells MC0 to MC3.

Initially, a signal, such as a voltage V0, is applied to word lines WL0 to WL3 and bit line BL. In some examples, a sense voltage (e.g., pulse) VDM1=V2−V1 is applied to memory cells MC0 to MC3 to determine their current states, where VDM1 is shown in FIG. 2A. For example, a signal, such as a voltage V1, is applied to word lines WL0 to WL3. The word line voltage signals VWL0 to VWL3 decrease from the initial voltage V0 to the voltage V1 in response to applying V1 to word lines WL0 to WL3.

Subsequently, a signal, that may include the sensing bit line voltage pulse VBLSENS and writing bit line voltage pulses VBLWRIT1 and VBLWRIT2, in FIG. 10A may be applied to bit line BL. For example, applying voltage pulse VBLSENS includes increasing the voltage on bit line BL from the voltage V0 to voltage V2 so the voltage pulse VBLSENS has a magnitude of V2−V0. For example, this results in applying the differential sense voltage pulse VDM1=V2−V1 between bit line BL and each of word lines WL0 to WL3, and thus to memory cells MC0 to MC3.

Bit line voltage signal VBL increases to voltage V3 in response to applying voltage pulse VBLSENS to bit line BL while word lines WL1 to WL3 are at voltage V1. Memory cell MC0 snaps back in response to the bit line voltage signal VBL reaching the voltage V3 while word lines WL0 to WL3 are at voltage V1. For example, the threshold voltage Vt0 of memory cell MC0 is Vt0=V3−V1 that is less than VDM1. Snapping back of memory cell MC0 indicates that memory cell MC0 is in the positive state 0 and does not need to be written.

In response to memory cell MC0 snapping back, the bit line voltage signal VBL decreases to a voltage V102; the word line voltage signal VWL0 increases from voltage V1 to a voltage V104; and the current signal IMC0 increases from current level I0 (about 0 amp) to a current level I101. The increase in the current signal IMC0 causes the bit line voltage signal VBL to start to increase, for example, from voltage V102 to voltage V2.

Sensing circuitry 1030-0 senses the increase in the voltage of word line voltage signal VWL0, thereby identifying memory cell MC0 as the memory cell snapping back, and thus being at positive state 1. Voltage signal IPULS10 decreases from voltage V6 to voltage V7 in response to sensing circuitry 1030-0 sensing the increase in the voltage of word line WL0, and thus memory cell MC0 snapping back. The sensing circuitry 1030-0 acts to turn off the current to word line WL0 in response to voltage signal IPULS10 decreasing to voltage level V7, and thus memory cell MC0 snapping back. For example, sensing circuitry 1030-0 acts to decouple word line WL0 from a voltage node (e.g., causing word line WL0 to float). The current signal IMC0 decreases to current level I0 from current level I101 while bit line voltage signal VBL increases to voltage V2.

The bit line voltage signal VBL increases from voltage V102 to voltage V2 without any additional snap backs. This indicates that memory cells MC1 to MC3 are at the positive state 0 and may need to be written to the positive state 1. The voltage pulse VBLSENS is then be removed from bit line BL so that the voltage on bit line BL is returned to voltage V0 while word lines WL1 to WL3 are at voltage V1 and while word line WL0 is at voltage V104. The bit line voltage signal VBL then decreases to the voltage V0 in response to removing the voltage pulse VBLSENS. The word line voltage signal remains at voltage V104 while bit line voltage signal VBL decreases to the voltage V0.

While the word line voltage signals VWL1 to VWL3 are at voltage V1, a signal pulse, such as the writing bit line voltage pulse VBLWRIT1 in FIG. 10A, is applied to bit line BL. For example, applying voltage pulse VBLWRIT1 includes increasing the voltage on bit line BL from the voltage V0 to voltage V110 (e.g., about 7.0 volts), so the voltage pulse VBLWRIT1 has a magnitude of V110−V0. For example, this results in applying a signal pulse, such as a differential write voltage pulse VWRITE01=V110−V1, between bit line BL and each of word lines WL0 to WL3, and thus to memory cells MC0 to MC3.

Bit line voltage signal VBL increases to a voltage V112 from voltage V0 in response to applying voltage pulse VBLWRIT1 to bit line BL while word lines WL1 to WL3 are at voltage V1 and word line WL0 is at voltage V104 that inhibits memory cell MC0 from changing state in response to voltage pulse VBLWRIT1. Memory cell MC1 snaps back in response to the bit line voltage signal VBL reaching the voltage V112 while word lines WL1 to WL3 are at voltage V1. For example, the threshold voltage Vt1 of memory cell MC1 is Vt1=V112−V1 that is less than VWRITE01.

In response to memory cell MC1 snapping back, the bit line voltage signal VBL decreases to a voltage V114; word line voltage signal VWL1 increases from voltage V1 to a voltage V116; and the current signal IMC1 increases from current level I0 to a current level I102 (e.g., to produce pulse of current, such as a current pulse, through memory cell MC1).

The sensing circuitry 1030-1 senses the increase in the voltage of word line voltage signal VWL1. Voltage signal IPULS11 decreases from voltage V6 to voltage V7 in response to sensing circuitry 1030-1 sensing the increase in the voltage of word line WL1, and thus memory cell MC1 snapping back. The sensing circuitry 1030-1 acts to turn off the current to word line WL1 in response to voltage signal IPULS11 decreasing to voltage V7, and thus memory cell MC1 snapping back. For example, sensing circuitry 1030-1 acts to decouple word line WL1 from a voltage node (e.g., causing word line WL1 to float). The current signal IMC1 decreases to current level I0 from current level I102 while bit line voltage signal VBL increases to voltage V120.

The voltage on word line WL0 remains at voltage V104; the voltage signal VWL1 increases to voltage V116; and the voltages on word lines WL2 and WL3 remain at voltage V1 while bit line voltage signal VBL increases to voltage V120. Memory cell MC2 snaps back in response to bit line voltage signal VBL reaching voltage V120. For example, the threshold voltage Vt2 of memory cell MC2 may be Vt2=V120−V1 that is less than VWRITE01.

In response to memory cell MC2 snapping back, the bit line voltage signal VBL decreases to a voltage V122; word line voltage signal VWL2 increases from voltage V1 to voltage V116; and the current signal IMC2 increases from current level I0 to a current level I103 (e.g., to produce pulse of current, such as a current pulse, through memory cell MC2).

Sensing circuitry 1030-2 senses the increase in the voltage of word line voltage signal VWL2. Voltage signal IPULS12 decreases from voltage V6 to voltage V7 in response to sensing circuitry 1030-2 sensing the increase in the voltage of word line WL2, and thus memory cell MC2 snapping back. The sensing circuitry 1030-2 acts to turn off the current to word line WL2 in response to voltage signal IPULS12 decreasing to voltage V7, and thus memory cell MC2 snapping back. For example, sensing circuitry 1030-2 acts to decouple word line WL2 from a voltage node (e.g., causing word line WL2 to float). The current signal IMC2 decreases to current level I0 from current level I103 while bit line voltage signal VBL increases to voltage V126.

The voltage on word line WL0 remains at voltage V104; the voltage on word line WL1 remains at voltage V116; the voltage signal VWL2 increases to voltage V116; and the voltage on word line WL3 remains at voltage V1 while bit line voltage signal VBL increases to voltage V126. Memory cell MC3 snaps back in response to bit line voltage signal VBL reaching voltage V126. For example, the threshold voltage Vt3 of memory cell MC3 is Vt3=V126–V1 that is less than VWRITE01.

In response to memory cell MC3 snapping back, the bit line voltage signal VBL decreases to a voltage V128; word line voltage signal VWL3 increases from voltage V1 to voltage V116; and the current signal IMC3 increases from current level I0 to a current level I104 (e.g., to produce pulse of current, such as a current pulse, through memory cell MC3).

Sensing circuitry 1030-3 senses the increase in the voltage of word line voltage signal VWL3. Voltage signal IPULS13 decreases from voltage V6 to voltage V7 in response to sensing circuitry 1030-3 sensing the increase in the voltage of word line WL3, and thus memory cell MC3 snapping back. The sensing circuitry 1030-3 acts to turn off the current to word line WL3 in response to voltage signal IPULS13 decreasing to voltage V7, and thus memory cell MC3 snapping back. For example, sensing circuitry 1030-3 acts to decouple word line WL3 from a voltage node (e.g., causing word line WL3 to float). The current signal IMC3 decreases to current level I0 from current level I104 while bit line voltage signal VBL increases to voltage V110.

After the bit line voltage signal VBL reaches voltage V110, the writing associated with applying the write voltage pulse VWRITE01 to memory cells MC1 to MC3 is completed, and the voltage pulse VBLWRIT1 is removed from bit line BL, so that the voltage applied to bit line BL is returned to voltage V0. For example, memory cells MC1 to MC3 may move toward state 1 in response to voltage pulse VBLWRIT1, and may be in an intermediate state between state 0 and state 1. In some examples, the sense operation described in conjunction with memory cell MC0 may be performed after the writing associated with applying the differential write voltage pulse VWRITE01 to memory cells MC1 to MC3 is completed.

In the example of FIG. 10B after the bit line voltage signal VBL reaches voltage V110, the voltage on word line WL0 is decreased from voltage V104 to voltage V1; the voltages on word lines WL1 to WL3 are decreased from voltage V116 to voltage V1; and the voltages of sensing circuitries 1030-0 to 1030-3 are reset to voltage V6. Although the example of FIG. 10B shows the voltage signals VWL1 to VWL3 increasing to the same voltage V116 in response to memory cells MC1 to MC3 respectively snapping back, the present disclosure is not so limited. In other examples, the voltage signals VWL1 to VWL3 may increase to different voltages in response to memory cells MC1 to MC3 respectively snapping back.

Subsequently, while the voltages on word lines WL1 to WL3 are once again at voltage V1, a signal pulse, such as the writing bit line voltage pulse VBLWRIT2 in FIG. 10A, is applied to bit line BL. For example, applying voltage pulse VBLWRIT2 includes increasing the voltage on bit line BL from the voltage V0 to voltage V110, so the voltage pulse VBLWRIT2 has a magnitude of V110–V0. For example, this results in applying a signal pulse, such as a differential write voltage pulse VWRITE02=V110–V1, between bit line BL and each of word lines WL1 to WL3, and thus to memory cells MC1 to MC3. Note, for example, that memory cell MC0 is already at positive state 1 and may be inhibited from writing, such as by applying a voltage to word line WL0 so that the voltage differential applied to memory cell MC0 is less than the threshold voltage of memory cell MC0.

In some examples, the bit line voltage signal VBL, the word line voltage signals VWL1 to VWL3, the output voltage signals respectively of sensing circuitries 1030-1 to 1030-3, and the current signals IMC1 to IMC3 may respond to applying voltage V1 to word lines WL1 to WL3 and applying voltage pulse VBLWRIT2 to bit line BL, and thus applying differential write voltage pulse VWRITE02 to memory cells MC1 to MC3, as previously described in response to applying voltage V1 to word lines WL1 to WL3 and applying voltage pulse VBLWRIT1 to bit line BL, and thus applying differential write voltage pulse VWRITE01 to memory cells MC1 to MC3.

For example, memory cells MC1 to MC3 snap back in response to applying differential write voltage pulse VWRITE02 to memory cells MC1 to MC3. The word line voltage signals VWL1 to VWL3, for example, respectively increase to voltage V116 from voltage V1 in response to memory cells MC1 to MC3 snapping back. Current signals IMC1 to IMC3, for example, respectively increase to current levels I102, I103, and I104 from current level I0 snapping back to form current pulses respectively through memory cells MC1 to MC3. For example, sensing circuitries 1030-1 to 1030-3 respectively turn off the current to word lines WL1 to WL3 in response to memory cells MC1 to MC3 respectively snapping back. For example, memory cells MC1 to MC3 may move further toward state 1 in response to voltage pulse VBLWRIT2. In some examples, the sense operation described in conjunction with memory cell MC0 may be performed after the writing associated with applying the differential write voltage pulse VWRITE02 to memory cells MC1 to MC3 is completed. In some examples, write voltage pulses may be applied to memory cells MC1 to MC3 until a sense operation verifies that memory cells MC1 to MC3 are at state 1. Differential write voltage pulses may be applied in a manner as previously described until the memory cells MC1 to MC3 reach state 1.

Using a plurality of pulses to program the memory cells may allow the energy delivered to the cells to be adjusted during each snapback event that may lead to a reduction in the overall energy consumption during programming. It may also allow the overall energy delivered to the cells to be adjusted by adjusting the number of snapback events. Turning off the current to a cell during each snapback may also reduce power consumption.

In the example of the parallel programming previously described in conjunction with FIG. 10B, the memory cells MC1 to MC3 may be selected one at a time by their respective snapback events. For example, the memory cells MC1 to MC3 may be selected one at time in order as a result of their respective threshold voltages (e.g., starting with memory cell MC1 having the lowest threshold voltage (e.g., and/or lowest threshold delay) and ending with memory cell MC3 having the highest threshold voltage (e.g., and/or highest threshold delay). This can prevent more than one cell from snapping back at a time. Detection circuitry (e.g. sensing circuitry) detects the snapback of a respective cell, turns that cell off, and allows the next cell (e.g., with the next highest threshold voltage) to be snapped back. The parallel programming in the example of FIG. 10B may act to amortize the individual threshold delays of memory cells MC1 to MC3 among memory cells MC1 to MC3.

The increase in the voltages of the word line signals VWL1 to VWL3 in response to the respective memory cells MC1 to MC3 snapping back may be a consequence of the current limiting by the detection circuitry. For example, the current in the respective word lines WL1 to WL3 increases as a result of the respective memory cells MC1 to MC3 snapping back. This prevents the other cells from snapping back.

Figure 11:
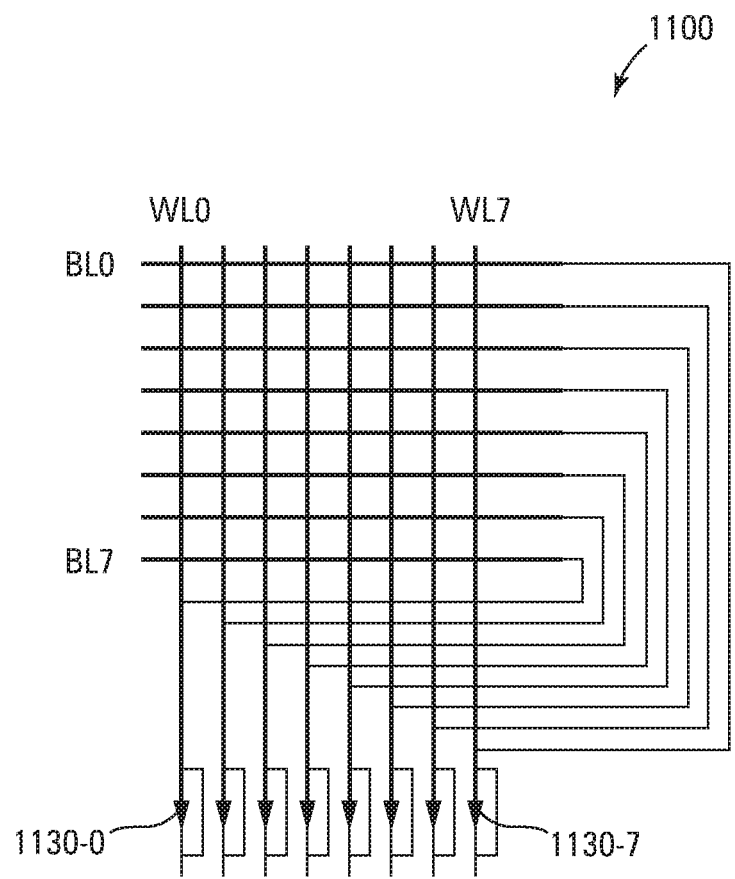
FIG. 11 illustrates a portion of a memory array and associated circuitry, in accordance with a number of embodiments of the present disclosure.

FIG. 11 illustrates a portion of a memory array 1100 and associated circuitry, in accordance with a number of embodiments of the present disclosure. For example, memory array 1100 may be a portion of memory array 100. In the example of FIG. 11, sensing circuitries 1130-0 to 1130-7 are shared by bit line BL0/word line WL0 to bit line BL7/word line WL7. For example, word lines WL0 to WL7 are respectively selectively electrically coupled to sensing circuitries 1130-0 to 1130-7 while bit lines BL0 to BL7 are respectively selectively electrically isolated from sensing circuitries 1130-0 to 1130-7 and vice versa.

A word line may be selectively electrically coupled to respective sensing circuitry when data stored by memory cells commonly coupled to the word line and respectively coupled to different bit lines are being compared to an input vector, such as in FIG. 4. A word line may be selectively electrically coupled to respective sensing circuitry when memory cells commonly coupled to the bit line and respectively coupled to different word lines are being written, such as in FIG. 10A. A bit line may be selectively electrically coupled to respective sensing circuitry when memory cells commonly coupled to the bit line and respectively coupled to different word lines are being compared to an input vector. A bit line may be selectively electrically coupled to respective sensing circuitry when memory cells commonly coupled to the word line and respectively coupled to different bit lines are being written, such as in FIG. 9A.

Figure 12:
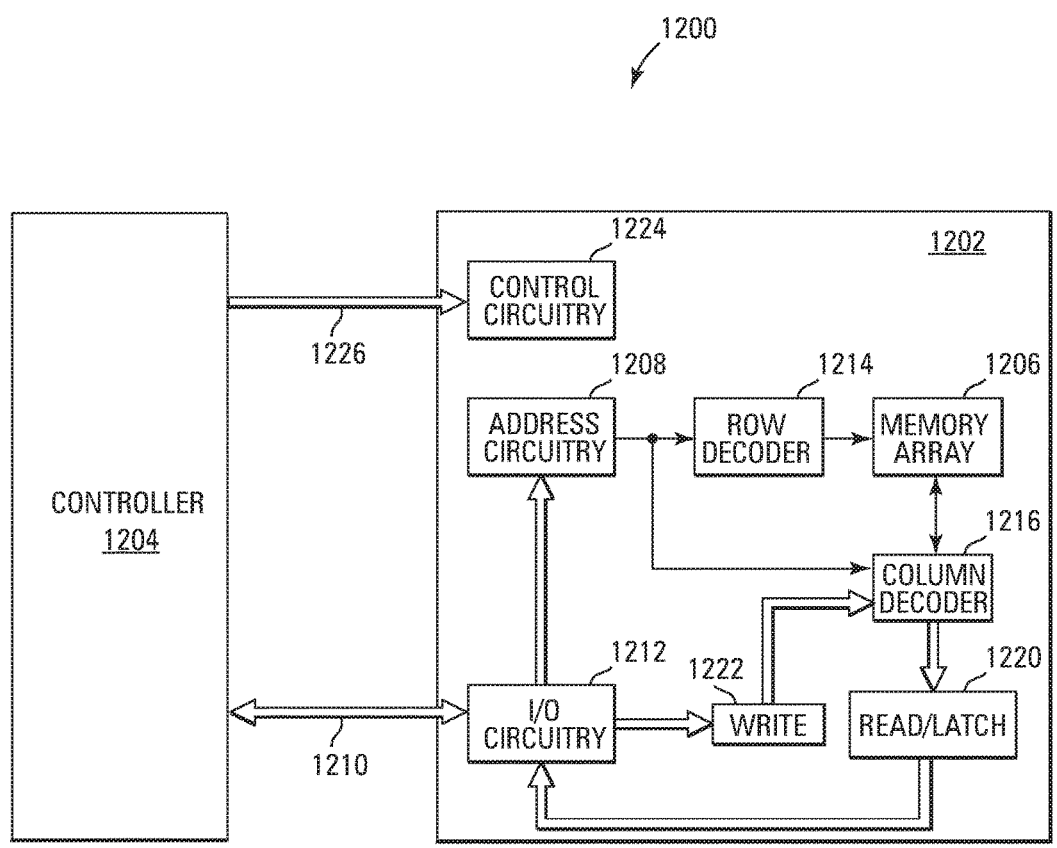
FIG. 12 is a block diagram illustrating an example of an apparatus, in accordance with a number of embodiments of the present disclosure.

FIG. 12 is a block diagram of an apparatus, such as an electronic memory system 1200, in accordance with a number of embodiments of the present disclosure. Memory system 1200 includes an apparatus, such as a memory device 1202, and a controller 1204, such as a memory controller (e.g., a host controller). Controller 1204 might include a processor, for example. Controller 1204 might be coupled to a host, for example, and may receive command signals (or commands), address signals (or addresses), and data signals (or data) from the host and may output data to the host.

Memory device 1202 includes a memory array 1206, such as a cross-point memory array, of memory cells. For example, memory array 1206 may include one or more of the memory arrays disclosed herein.

Memory device 1202 includes address circuitry 1208 to latch address signals provided over I/O connections 1210 through I/O circuitry 1212. Address signals are received and decoded by a row decoder 1214 and a column decoder 1216 to access the memory array 1206. For example, row decoder 1214 and/or a column decoder 1216 may include drivers, such as drivers 550 and 552, as previously described in conjunction with FIG. 5, or drivers 650 and 652, as previously described in conjunction with FIG. 6.

Memory device 1202 may sense (e.g., read) data in memory array 1206 by sensing voltage and/or current changes in the memory array columns using sense/buffer circuitry that in some examples may be read/latch circuitry 1220. Read/latch circuitry 1220 may read and latch data from the memory array 1206. I/O circuitry 1212 is included for bi-directional data communication over the I/O connections 1210 with controller 1204. Write circuitry 1222 is included to write data to memory array 1206.

Control circuitry 1224 may decode signals provided by control connections 1226 from controller 1204. These signals may include chip signals, write enable signals, and address latch signals that are used to control the operations on memory array 1206, including data read and data write operations.

Control circuitry 1224 may be included in controller 1204, for example. Controller 1204 may include, other circuitry, firmware, software, or the like, whether alone or in combination. Controller 1204 may be an external controller (e.g., in a separate die from the memory array 1206, whether wholly or in part) or an internal controller (e.g., included in a same die as the memory array 1206). For example, an internal controller might be a state machine or a memory sequencer.

In some examples, controller 1204 may be configured to cause memory device 1202 to at least perform the methods disclosed herein, such as the comparisons, sensing, and writing. In some examples, memory device 1202 may include the sense amplifier/feedback circuitries and latches, such as latches 440, 540, 640, disclosed herein. For example, memory device 1202 may include the circuitry previously described in conjunction with FIGS. 5 and 6.

As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

It will be appreciated by those skilled in the art that additional circuitry and signals can be provided, and that the memory system 1200 of FIG. 12 has been simplified. It should be recognized that the functionality of the various block components described with reference to FIG. 12 may not necessarily be segregated to distinct components or component portions of an integrated circuit device. For example, a single component or component portion of an integrated circuit device could be adapted to perform the functionality of more than one block component of FIG. 12. Alternatively, one or more components or component portions of an integrated circuit device could be combined to perform the functionality of a single block component of FIG. 12.

It will be appreciated that the computing functions discussed previously in conjunction with the examples of the XOR operation and the examples of parallel access discussed previously in conjunction with the examples of parallel sensing and parallel writing may be implemented independently on general memory devices, such as memory device 1202, that may be used in solid state memories (e.g. that may employ resistance-variable memory cells).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A method, comprising:
comparing first input data to first stored data stored in a first memory cell by applying a first voltage differential across the first memory cell during a first time period;
comparing second input data to second stored data stored in a second memory cell by applying a second voltage differential across the second memory cell during a second time period, wherein the first and second voltage differentials have opposite polarities; and determining whether the first input data matches the first stored data based on whether the first memory cell snaps back in response to applying the first voltage differential across the first memory cell.

2. The method of claim 1, wherein the first memory cell and the second memory cell are part of a group of memory cells and the first and second stored data are part of a stored data vector stored by the group, wherein an input vector comprises the first and second input data, and wherein the method further comprises:
comparing the input vector to the stored data vector;
responsive to determining that any one of the cells in the group snaps back in response to applied voltage differentials across the memory cells in the group, determining a mismatch between the input vector and the stored data vector; and
responsive to determining that none of the cells in the group snaps back in response to the applied voltage differentials, determining a match between the input vector and the stored data vector.

3. The method of claim 1, further comprising determining that the first input data mismatches the first stored data in response to the first memory cell snapping back.

4. The method of claim 3, further comprising, in response to the first memory cell snapping back, storing data in a latch to indicate that the first input data mismatches the first stored data.

5. The method of claim 3, further comprising preventing additional memory cells from snapping back in response to the first memory cell snapping back.

6. The method of claim 3, further comprising preventing comparisons between additional input data and data stored in additional memory cells in response to the first memory cell snapping back.

7. The method of claim 3, further comprising inhibiting current on a signal line coupled to the first memory cell in response to the first memory cell snapping back.

8. The method of claim 1, further comprising determining whether the second input data matches the second stored data based on whether the second memory cell snaps back in response to applying the second voltage differential across the memory cell.

9. The method of claim 1, further comprising:
determining a match between the first input data and the first stored data responsive to the first memory cell not snapping back in response to applying the first voltage differential across the first memory cell.

10. An apparatus, comprising:
a plurality of first signal lines;
a second signal line;
a plurality of memory cells commonly coupled to the second signal line and to respective different ones of the plurality of first signal lines; and
sensing circuitry coupled to the second signal line and configured to indicate that input data mismatches stored data stored in the plurality of memory cells responsive to sensing a snapback event on the second signal line indicative of at least one of the plurality of memory cells snapping back responsive to a first voltage being applied to the plurality of first signal lines and a second voltage being applied to the second signal line;
wherein a difference between the first voltage and the second voltage has a first polarity or a second polarity opposite to the first polarity, and wherein the sensing circuitry comprises a sense amplifier responsive to the first polarity and the second polarity, the sense amplifier configured to sense the snapback event; and
wherein the sensing circuitry further comprises a latch coupled to the sense amplifier and configured to receive a first signal from the sense amplifier responsive to the sense amplifier sensing the snapback event responsive to the first polarity and to receive a second signal from the sense amplifier responsive to the sense amplifier sensing the snapback event responsive to the second polarity, wherein the latch is configured to store a data value, indicating the mismatch between the input data and the stored data, responsive to receiving the first signal or the second signal.

11. The apparatus of claim 10, wherein the sensing circuitry is configured to turn off current to the second signal line responsive to sensing the snapback event on the second signal line.

12. The apparatus of claim 11, wherein turning off the current to the second signal line acts to prevent any other memory cell of the plurality of memory cells from snapping back.

13. The apparatus of claim 10, wherein the latch is configured to:
output a third signal, responsive to receiving the first signal, that causes the apparatus to turn off current to the second signal line; and
output a fourth signal, responsive to receiving the second signal, that causes the apparatus to turn off the current to the second signal line.

14. An apparatus, comprising:
an array comprising snapback memory cells;
a controller coupled to the array and configured to implement an XOR function between an input data value and a data value stored by a memory cell of the array by:
responsive to the input data value being a first value:
applying a first voltage differential across the memory cell, the first voltage differential having a first polarity; and
determining whether the memory cell snaps back in response to the applied first voltage differential; and
responsive to the input data value being a second value:
applying a second voltage differential across the memory cell, the second voltage differential having a second polarity opposite to the first polarity; and
determining whether the memory cell snaps back in response to the applied second voltage differential.

15. The apparatus of claim 14, wherein the controller is configured to:
cause the apparatus to indicate a match between the first value and the stored data value in response to determining that the memory cell does not snap back in response to the applied first voltage differential and to indicate a match between the second value and the stored data value in response to determining that the memory cell does not snap back in response to the applied second voltage differential; and
cause the apparatus to indicate a mismatch between the first value and the stored data value in response to determining that the memory cell snaps back in response to the applied first voltage differential and to indicate a mismatch between the second value and the stored data value in response to determining that the memory cell snaps back in response to the applied second voltage differential.

16. The apparatus of claim 14, wherein the controller is configured to implement ternary functions responsive to the memory cell being in a drifted state, comprising a first threshold voltage having the first polarity and a second threshold voltage having the second polarity, wherein a magnitude of the first threshold voltage is greater than a magnitude of the first voltage differential and a magnitude of the second threshold voltage is greater than a magnitude of the second voltage differential.

17. The apparatus of claim 14, wherein each snapback memory cell is a self-selecting memory cell in which a single material serves as a select element and a storage element.

18. The apparatus of claim 17, wherein single material is a chalcogenide material.

19. The apparatus of claim 14, wherein each snapback memory cell exhibits an asymmetric threshold voltage distribution depending on a polarity of programming.

20. Detection circuitry, comprising:
a first feedback circuit configured to provide feedback to a signal line driver from a latch in association with sensing a snapback memory cell using a first polarity signal;
a second feedback circuit configured to provide feedback to the signal line driver from the latch in association with sensing the snapback memory cell using a second polarity signal; and
wherein the latch is configured to latch a first data value responsive to a snapback event detected by either of the first feedback circuit and the second feedback circuit.

21. The detection circuitry of claim 20, wherein the first and second feedback circuits each comprise a feedback latch.

22. The detection circuitry of claim 20, wherein
the first feedback circuit comprises first circuitry coupled to the signal line driver and configured to receive a first signal from the latch in response to the first feedback circuit detecting a snapback event in response to the memory cell snapping back in response to the first polarity signal being applied across the memory cell; and
the second feedback circuit comprises second circuitry coupled to the signal line driver and configured to receive a second signal from the latch in response to the second feedback circuit detecting a snapback event in response to the memory cell snapping back in response to the second polarity signal being applied across the memory cell.

23. The detection circuitry of claim 22, wherein the first circuitry is configured to cause the signal line driver to turn off current to the memory cell in response to receiving the first signal from the latch, and the second circuitry is configured to cause the signal line driver to turn off current to the memory cell in response to receiving the second signal from the latch.

24. The detection circuitry of claim 20, wherein
the first feedback circuit comprises pull-down circuitry and the latch comprises first load circuitry coupled to the pull-down circuitry, the first load circuitry coupled to the pull-down circuitry acting as a first comparator; and
the second feedback circuit comprises pull-up circuitry and the latch comprises second load circuitry coupled to the pull-up circuitry, the second load circuitry coupled to the pull-up circuitry acting as a second comparator.

25. The detection circuitry of claim 20, further comprising switching circuitry coupled to the latch and configured to set operating voltage ranges of the latch.

26. The detection circuitry of claim 20, wherein the first feedback circuit comprises n-channel devices and the second feedback circuit comprises p-channel devices.

* * * * *